United States Patent
Kurafuchi et al.

(10) Patent No.: US 9,075,307 B2
(45) Date of Patent: Jul. 7, 2015

(54) PHOTOSENSITIVE RESIN COMPOSITION FOR PROTECTIVE FILM OF PRINTED WIRING BOARD FOR SEMICONDUCTOR PACKAGE

(75) Inventors: Kazuhiko Kurafuchi, Tsukuba (JP); Toshizumi Yoshino, Kamisu (JP); Hideyuki Katagi, Tsukuba (JP); Masaya Ookawa, Kamisu (JP); Yoshiaki Fuse, Kamisu (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 317 days.

(21) Appl. No.: 13/062,038

(22) PCT Filed: Aug. 28, 2009

(86) PCT No.: PCT/JP2009/065069
§ 371 (c)(1),
(2), (4) Date: May 27, 2011

(87) PCT Pub. No.: WO2010/026927
PCT Pub. Date: Mar. 11, 2010

(65) Prior Publication Data
US 2011/0223539 A1    Sep. 15, 2011

(30) Foreign Application Priority Data
Sep. 4, 2008   (JP) ................ P2008-227156

(51) Int. Cl.
G03F 7/028   (2006.01)
G03F 7/038   (2006.01)
G03F 7/004   (2006.01)
H05K 3/28    (2006.01)

(52) U.S. Cl.
CPC ............ *G03F 7/0388* (2013.01); *G03F 7/0047* (2013.01); *H05K 3/287* (2013.01); *G03F 7/0385* (2013.01)

(58) Field of Classification Search
None
See application file for complete search history.

(56) References Cited

U.S. PATENT DOCUMENTS

| | | | | |
|---|---|---|---|---|
| 4,271,258 | A | * | 6/1981 | Watariguchi ............... 430/284.1 |
| 4,284,707 | A | * | 8/1981 | Nagasawa et al. ............ 430/196 |
| 4,390,615 | A | * | 6/1983 | Courtney et al. ............ 430/315 |
| 4,996,132 | A | * | 2/1991 | Tazawa et al. ............ 430/286.1 |
| 5,702,820 | A | * | 12/1997 | Yokoshima et al. ........... 428/413 |
| 6,509,398 | B1 | * | 1/2003 | Allard et al. ..................... 524/91 |
| 6,583,198 | B2 | * | 6/2003 | Sato et al. ..................... 522/100 |
| 2007/0218374 | A1 | * | 9/2007 | Kitano et al. ................... 430/14 |

FOREIGN PATENT DOCUMENTS

| | | |
|---|---|---|
| JP | 11-240930 | 9/1999 |
| JP | 2002-162738 A | 6/2002 |
| JP | 2002-293876 A | 10/2002 |
| JP | 2002-303974 A | 10/2002 |
| JP | 2003-140334 A | 5/2003 |
| JP | 2003-198105 | 7/2003 |
| JP | 2004-138835 | 5/2004 |
| JP | 2007-079120 A | 3/2007 |
| JP | 2007-171812 A | 7/2007 |
| JP | 2007-224169 A | 9/2007 |
| JP | 2008-063572 A | 3/2008 |
| JP | 2008-189803 A | 8/2008 |
| JP | 2009-083482 A | 4/2009 |
| KR | 10-2007-0036816 A | 4/2007 |
| WO | 2007/108171 A1 | 9/2007 |
| WO | WO-2008/051373 A2 * | 5/2008 |

OTHER PUBLICATIONS

English translation of JP, 2003-140334 , A (2003) from machine translation from AIPN Japan Patent Office National Center for Industrial Property Information and Training, generated Mar. 10, 2012, 31 pages.*
English translation of JP, 2004-138835 , A (2004) from machine translation from AIPN Japan Patent Office National Center for Industrial Property Information and Training, generated Nov. 13, 2012, 16 pages.*
English translation of JP, 2008-189803 , A (2008) from machine translation from AIPN Japan Patent Office National Center for Industrial Property Information and Training, generated Mar. 10, 2013, 22 pages.*
International Search Report issued in corresponding application PCT/JP2009/065069, completed Oct. 1, 2009 and mailed Oct. 13, 2009.
International Preliminary Report on Patentability issued in corresponding application PCT/JP2009/065069 on Apr. 12, 2011.
Office Action issued in corresponding Chinese application No. 200980134218.3 on Mar. 31, 2012 (no translation available; submitted for certification).
Japanese Office Action issued in counterpart application P2010-527771, completed on Aug. 2, 2011 (no translation available; submitted for certification purposes only).
Notice of Allowance issued in counterpart Korean application 10-2010-7028599 on Aug. 30, 2013 (no translation available; submitted for certification).

* cited by examiner

*Primary Examiner* — Cynthia Hamilton
(74) *Attorney, Agent, or Firm* — Griffin & Szipl, P.C.

(57) ABSTRACT

The photosensitive resin composition for a protective film of a printed wiring board for a semiconductor package, according to the invention, comprises (A) an acid-modified vinyl group-containing epoxy resin, (B) a phenol compound, (C) a compound having at least one ethylenically unsaturated group in each molecule, (D) a photopolymerization initiator and (E) inorganic fine particles.

9 Claims, No Drawings

PHOTOSENSITIVE RESIN COMPOSITION FOR PROTECTIVE FILM OF PRINTED WIRING BOARD FOR SEMICONDUCTOR PACKAGE

This is a National Phase Application in the United States of International Patent Application No. PCT/JP2009/065069 filed Aug. 28, 2009, which claims priority on Japanese Patent Application No. P2008-227156, filed Sep. 4, 2008.

TECHNICAL FIELD

The present invention relates to a photosensitive resin composition for a protective film of a printed wiring board for a semiconductor package.

BACKGROUND ART

In the field of printed wiring boards, permanent mask resists (protective films) have conventionally been formed on printed wiring boards. In steps of flip-chip mounting of semiconductor elements on printed wiring boards using solder, permanent mask resists serve the role of preventing adhesion of solder onto undesired sections of the conductive layer of the printed wiring board. Permanent mask resists also serve the role of preventing corrosion of the conductive layer and of maintaining the electrical insulating properties between conductive layers, during use of the printed wiring board.

In the prior art, permanent mask resists for printed wiring board production are manufactured by, for example, methods of screen printing of thermosetting or photosensitive resin compositions.

For example, in flexible wiring boards employing such mounting systems as FC, TAB and COF, a thermosetting resin paste is screen printed on areas except for the rigid wiring board, IC chip, electronic part or LCD panel and connection wiring pattern sections, and then the thermosetting resin paste is thermoset to form a permanent mask resist (see Patent document 1, for example).

Also, in semiconductor package boards such as BGA (ball grid arrays) or CSP (chip-size packages), that are loaded in personal computers, it is necessary to remove the joined sections of the permanent mask resist: (1) for flip-chip mounting of the semiconductor element on the semiconductor package board via solder, (2) for wire bonding joints between the semiconductor element and semiconductor package board, and (3) for solder joining of the semiconductor package board on a motherboard substrate, and the permanent mask resists used have been photosensitive resin compositions which facilitate such removal (see Patent document 2, for example).

CITATION LIST

Patent Literature

[Patent document 1] Japanese Unexamined Patent Application Publication No. 2003-198105
[Patent document 2] Japanese Unexamined Patent Application Publication HEI No. 11-240930

SUMMARY OF INVENTION

Technical Problem

With increasingly high density of wiring patterns in recent years, permanent mask resists are required to have high resolution and it is becoming common to employ photosensitive resin compositions in pattern formation by photolithography. Of these, alkali-developing types that can be developed by weak alkaline aqueous solutions such as aqueous sodium carbonate, are becoming commonplace from the viewpoint of working environment conservation and global environmental conservation.

However, alkali-developing photosensitive resin composition are still problematic in terms of durability. Specifically, they exhibit poorer chemical resistance, water resistance, heat resistance and resistance to moist heat, compared to conventional thermosetting and solvent-developing types. This is because the main component of an alkali-developing photosensitive resin composition is a compound with a hydrophilic group to allow alkali development, and chemical solutions, water, water vapor and the like readily penetrate into them. PCT resistance (pressure cooker test resistance), which may be considered resistance to moist heat, is required especially for semiconductor packages such as BGAs or CSPs, and under such severe conditions the adhesion between the underfill material which fills the area between the semiconductor element and solder resist, and the cured film serving as the permanent mask resist, decreases markedly within several hours to several dozen hours.

It is an object of the present invention, which has been accomplished in light of the aforementioned problems of the prior art, to provide a photosensitive resin composition for a protective film of a printed wiring board for a semiconductor package, which exhibits excellent adhesion between the underfill material and the cured film serving as the permanent mask resist, even after prolonged PCT resistance testing.

Solution to Problem

In order to achieve the object stated above, the invention provides a photosensitive resin composition for a protective film of a printed wiring board for a semiconductor package, which comprises (A) an acid-modified vinyl group-containing epoxy resin, (B) a phenol compound, (C) a compound having at least one ethylenically unsaturated group in each molecule, (D) a photopolymerization initiator, and (E) inorganic fine particles.

Such a photosensitive resin composition having the constitution specified above can form a cured film as a permanent mask resist exhibiting excellent adhesion with the underfill material, even after prolonged PCT resistance testing. The cured film formed by the photosensitive resin composition also has excellent soldering heat resistance. Thus, the photosensitive resin composition of the invention is highly useful as a photosensitive resin composition for a protective film of a printed wiring board for a semiconductor package.

In the photosensitive resin composition of the invention, the (B) phenol compound is preferably a compound represented by the following formula (1), from the viewpoint of achieving more satisfactory adhesion between the underfill material and the cured film as the permanent mask resist, even after prolonged PCT resistance testing.

[Formula 1]

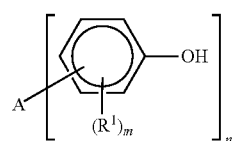

(1)

[In formula (1), $R^1$ represents a $C_1$-$C_5$ alkyl group, m represents an integer of 1-4, n represents an integer of 1-4 and A represents an organic group with a valency of n. When m and/or n is 2 or greater, a plurality of $R^1$ groups may be the same or different.]

From the viewpoint of achieving more satisfactory adhesion between the underfill material and the cured film as the permanent mask resist even after a prolonged PCT resistance test, A in formula (1) is preferably a divalent to tetravalent $C_1$-$C_5$ hydrocarbon group, a trivalent organic group represented by the following formula (2) or a trivalent organic group represented by the following formula (3). From the same viewpoint, at least one $R^1$ in formula (1) is preferably a tert-butyl group.

[Formula 2]

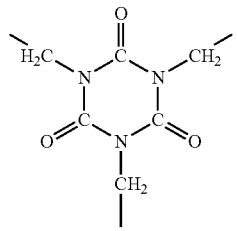

(2)

[Formula 3]

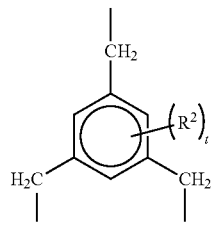

(3)

[In formula (3), $R^2$ represents a $C_1$-$C_5$ alkyl group and t represents an integer of 1-3.]

From the viewpoint of allowing alkali development and exhibiting excellent resolution and adhesion, the (A) acid-modified vinyl group-containing epoxy resin in the photosensitive resin composition of the invention is preferably a resin obtained by reacting a saturated or unsaturated group-containing polybasic acid anhydride (c) with a resin obtained by reacting a vinyl group-containing monocarboxylic acid (b) with at least one type of epoxy resin (a) selected from the group consisting of novolac-type epoxy resins represented by the following formula (4), bisphenol-type epoxy resins represented by the following formula (5), salicylaldehyde-type epoxy resins represented by the following formula (6) and bisphenol-type novolac resins having a repeating unit represented by the following formula (7) or (8).

[Formula 4]

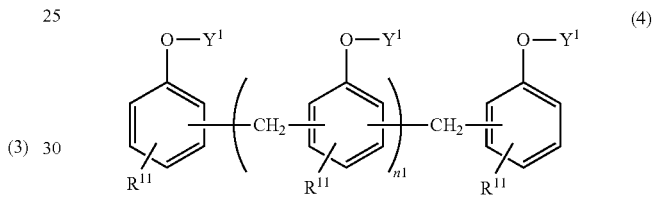

(4)

[In formula (4), $R^{11}$ represents hydrogen or a methyl group, $Y^1$ represents hydrogen or a glycidyl group, and n1 represents an integer of 1 or greater. A plurality of $R^{11}$ and $Y^1$ groups may be the same or different. However, at least one $Y^1$ represents a glycidyl group.]

[Formula 5]

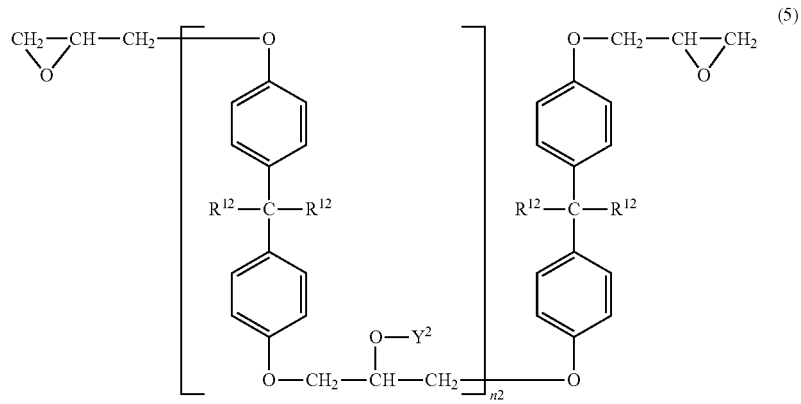

(5)

[In formula (5), $R^{12}$ represents hydrogen or a methyl group, $Y^2$ represents hydrogen or a glycidyl group, and n2 represents an integer of 1 or greater. A plurality of $R^{12}$ groups may be the same or different. When n2 is 2 or greater, a plurality of $Y^2$ groups may be the same or different.]

[Formula 6]

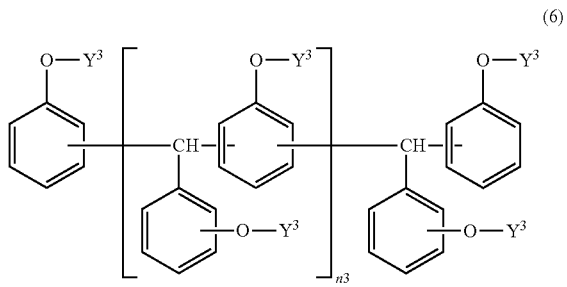

(6)

[In formula (6), $Y^3$ represents hydrogen or a glycidyl group, and n3 represents an integer of 1 or greater. A plurality of $Y^3$ groups may be the same or different. However, at least one $Y^3$ represents a glycidyl group.]

[Formula 7]

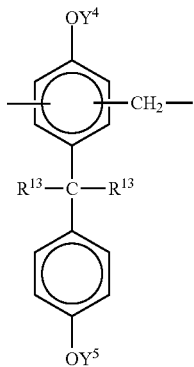

(7)

[In formula (7), $R^{13}$ represents hydrogen or a methyl group, and $Y^4$ and $Y^5$ each independently represent hydrogen or a glycidyl group. The two $R^{13}$ groups may be the same or different. However, at least one of $Y^4$ and $Y^5$ represents a glycidyl group.]

[Formula 8]

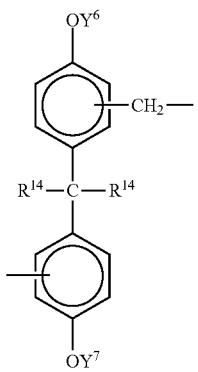

(8)

[In formula (8), $R^{14}$ represents hydrogen or a methyl group, and $Y^6$ and $Y^7$ each independently represent hydrogen or a glycidyl group. The two $R^{14}$ groups may be the same or different. However, at least one of $Y^6$ and $Y^7$ represents a glycidyl group.]

The content of the (E) inorganic fine particles in the photosensitive resin composition of the invention is preferably 15-80 mass % based on the total solid mass of the photosensitive resin composition. This can further improve the strength of the cured film formed from the photosensitive resin composition, as well as the heat resistance, insulating reliability, thermal shock resistance and resolution.

The photosensitive resin composition of the invention preferably further comprises (F) a curing agent. By comprising (F) a curing agent it is possible to further improve the heat resistance of the cured film formed from the photosensitive resin composition, as well as the adhesion to the underfill material and chemical resistance.

The photosensitive resin composition of the invention preferably further comprises (G) an elastomer. By comprising (G) an elastomer it is possible to further improve the flexibility of the cured film formed from the photosensitive resin composition, and the adhesion to the underfill material.

Advantageous Effects of Invention

According to the invention it is possible to provide a photosensitive resin composition for a protective film of a printed wiring board for a semiconductor package, which exhibits excellent adhesion between the underfill material and the cured film serving as the permanent mask resist, even after prolonged PCT resistance testing, as well as excellent soldering heat resistance.

DESCRIPTION OF EMBODIMENTS

Preferred embodiments of the invention will now be described in detail. According to the invention, the term "(meth)acrylic" refers to "acrylic" and the corresponding "methacrylic", while "(meth)acrylate" means acrylate and its corresponding "methacrylate".

The photosensitive resin composition for a protective film of a printed wiring board for a semiconductor package, according to the invention, comprises (A) an acid-modified vinyl group-containing epoxy resin (hereinafter also referred to as "component (A)"), (B) a phenol compound (hereinafter also referred to as "component (B)"), (C) a compound having at least one ethylenically unsaturated group in each molecule (hereinafter also referred to as "component (C)"), (D) a photopolymerization initiator (hereinafter also referred to as "component (D)") and (E) inorganic fine particles (hereinafter also referred to as "component (E)"). These components will now be explained in detail.

<(A) Acid-Modified Vinyl Group-Containing Epoxy Resin>

The (A) acid-modified vinyl group-containing epoxy resin may be, for example, a resin which is an epoxy resin modified with a vinyl group-containing monocarboxylic acid, and particularly preferred for use is a resin (A') obtained by reacting a vinyl group-containing monocarboxylic acid (b) with at least one type of epoxy resin (a) selected from the group consisting of novolac-type epoxy resins represented by the following formula (4), bisphenol-type epoxy resins represented by the following formula (5), salicylaldehyde-type epoxy resins represented by the following formula (6) and bisphenol-type novolac resins having a repeating unit represented by the following formula (7) or (8).

[Formula 4]

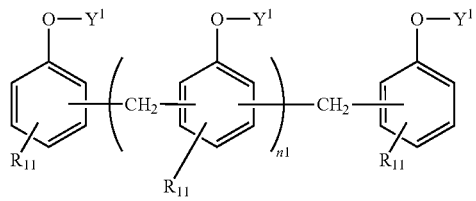

(4)

[In formula (4), $R^{11}$ represents hydrogen or a methyl group, $Y^1$ represents hydrogen or a glycidyl group, and n1 represents an integer of 1 or greater. A plurality of $R^{11}$ and $Y^1$ groups may be the same or different. However, at least one $Y^1$ represents a glycidyl group.]

[Formula 5]

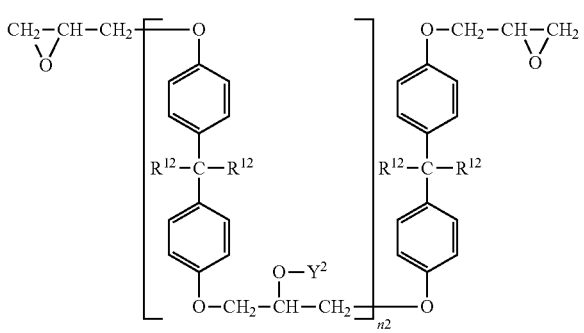

(5)

[In formula (5), $R^{12}$ represents hydrogen or a methyl group, $Y^2$ represents hydrogen or a glycidyl group, and n2 represents an integer of 1 or greater. A plurality of $R^{12}$ groups may be the same or different. When n2 is 2 or greater, a plurality of $Y^2$ groups may be the same or different.]

[Formula 6]

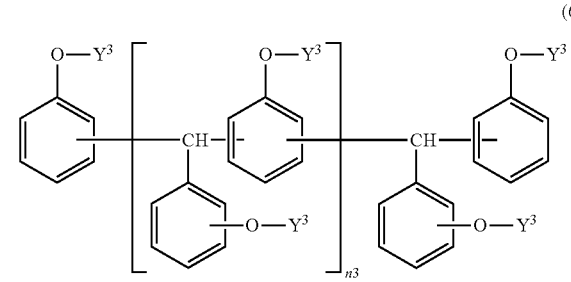

(6)

[In general formula (6), $Y^3$ represents hydrogen or a glycidyl group, and n3 represents an integer of 1 or greater. A plurality of $Y^3$ groups may be the same or different. However, at least one $Y^3$ represents a glycidyl group.]

[Formula 7]

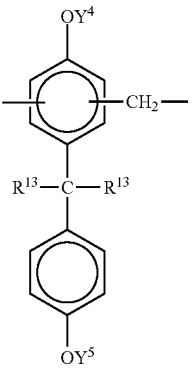

(7)

[In formula (7), $R^{13}$ represents hydrogen or a methyl group, and $Y^4$ and $Y^5$ each independently represent hydrogen or a glycidyl group. The two $R^{13}$ groups may be the same or different. However, at least one of $Y^4$ and $Y^5$ represents a glycidyl group.]

[Formula 8]

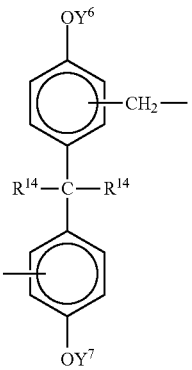

(8)

[In formula (8), $R^{14}$ represents hydrogen or a methyl group, and $Y^6$ and $Y^7$ each independently represent hydrogen or a glycidyl group. The two $R^{14}$ groups may be the same or different. However, at least one of $Y^6$ and $Y^7$ represents a glycidyl group.]

The resin (A') is assumed to be one having a hydroxyl group formed by addition reaction between the epoxy group of an epoxy resin (a) and the carboxyl group of a vinyl group-containing monocarboxylic acid (b).

The novolac-type epoxy resin represented by formula (4) may be a phenol-novolac-type epoxy resin, cresol-novolac-type epoxy resin, or the like. Such novolac-type epoxy resins can be obtained, for example, by reacting a phenol-novolac resin or cresol-novolac resin with epichlorohydrin by a known method.

The epoxy resin (a) is preferably a novolac-type epoxy resin represented by formula (4), from the viewpoint of excellent process tolerance and improved solvent resistance.

Commercially available examples of the phenol-novolac-type epoxy resin or cresol-novolac-type epoxy resin represented by formula (4) include YDCN-701, YDCN-702, YDCN-703, YDCN-704, YDCN-704 L, YDPN-638, YDPN-602 (all trade names of Tohto Kasei Co., Ltd.), DEN-431, DEN-439 (both trade names of The Dow Chemical Company), EOCN-120, EOCN-102S, EOCN-103S, EOCN-104S, EOCN-1012, EOCN-1025, EOCN-1027, BREN (all trade names of Nippon Kayaku Co., Ltd.), EPN-1138, EPN-1235, EPN-1299 (all trade names of Ciba Specialty Chemicals Co., Ltd.), N-730, N-770, N-865, N-665, N-673, VH-4150 and VH-4240 (all trade names of Dainippon Ink and Chemicals, Inc.).

Also, a bisphenol A-type epoxy resin or bisphenol F-type epoxy resin, which is represented by formula (5) and wherein $Y^2$ is a glycidyl group:

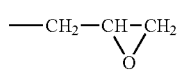

[Formula 15a]

may be obtained by, for example, reacting the hydroxyl group of a bisphenol A-type epoxy resin or bisphenol F-type epoxy resin represented by the following formula (9) with epichlorohydrin.

[Formula 9]

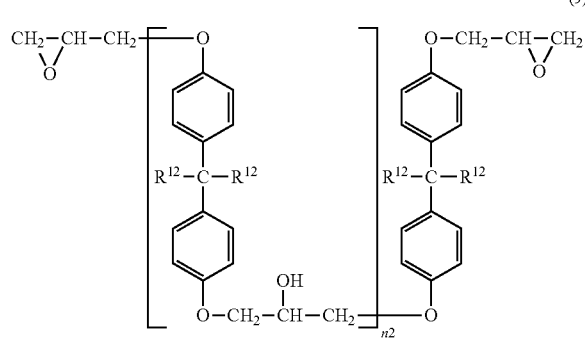

(9)

[In the formula, $R^{12}$ represents hydrogen or a methyl group, and n2 is an integer of 1 or greater.]

In order to promote reaction between the hydroxyl group and epichlorohydrin, reaction is preferably carried out at a reaction temperature of 50-120° C. in a polar organic solvent such as dimethylformamide, dimethylacetamide or dimethyl sulfoxide, in the presence of an alkali metal hydroxide. At a reaction temperature of below 50° C. the reaction will tend to take place slowly, while at a reaction temperature of 120° C. more secondary reactions will tend to occur.

Commercially available examples of the bisphenol A-type epoxy resins or bisphenol F-type epoxy resins represented by formula (5) include EPIKOTE807, 815, 825, 827, 828, 834, 1001, 1004, 1007 and 1009 (all trade names of Japan Epoxy Resins Co., Ltd.), DER-330, DER-301, DER-361 (all trade names of The Dow Chemical Company), YD-8125, YDF-170, YDF-170, YDF-175S, YDF-2001, YDF-2004 and YDF-8170 (all trade names of Tohto Kasei Co., Ltd.).

Commercially available examples of the salicylaldehyde-type epoxy resins represented by formula (6) include FAE-2500, EPPN-501H and EPPN-502H (all trade names of Nippon Kayaku Co., Ltd.).

From the viewpoint of allowing the warping property of thin-film boards to be further reduced while also allowing further improvement in the thermal shock resistance, the epoxy resin (a) is preferably an epoxy resin having a repeating unit represented by formula (7) and/or formula (8).

Commercially available products of formula (8) wherein $R^{14}$ is hydrogen and $Y^6$ and $Y^7$ are glycidyl groups include the EXA-7376 Series (trade name of Dainippon Ink and Chemicals, Inc.), and those wherein $R^{14}$ is a methyl group and $Y^6$ and $Y^7$ are glycidyl groups include the EPON SU8 Series (trade name of Japan Epoxy Resins Co., Ltd.).

Examples for the vinyl group-containing monocarboxylic acid (b) include acrylic acid derivatives such as acrylic acid, acrylic acid dimer, methacrylic acid, β-furfurylacrylic acid, β-styrylacrylic acid, cinnamic acid, crotonic acid and α-cyanocinnamic acid, half ester compounds that are reaction products of hydroxyl group-containing acrylates and dibasic acid anhydrides, and half ester compounds that are reaction products of vinyl group-containing monoglycidyl ethers or vinyl group-containing monoglycidyl esters and dibasic acid anhydrides.

A half ester compound is obtained by reacting a hydroxyl group-containing acrylate, vinyl group-containing monoglycidyl ether or vinyl group-containing monoglycidyl ester with a dibasic acid anhydride at an equimolar ratio. These vinyl group-containing monocarboxylic acids (b) may be used alone or in combinations of two or more.

Examples of hydroxyl group-containing acrylates, vinyl group-containing monoglycidyl ethers and vinyl group-containing monoglycidyl esters to be used for synthesis of the half ester compound, as an example of the vinyl group-containing monocarboxylic acid (b), include hydroxyethyl acrylate, hydroxyethyl methacrylate, hydroxypropyl acrylate, hydroxypropyl methacrylate, hydroxybutyl acrylate, hydroxybutyl methacrylate, polyethyleneglycol monoacrylate, polyethyleneglycol monomethacrylate, trimethylolpropane diacrylate, trimethylolpropane dimethacrylate, pentaerythritol triacrylate, pentaerythritol trimethacrylate, dipentaerythritol pentaacrylate, pentaerythritol pentamethacrylate, glycidyl acrylate and glycidyl methacrylate.

The dibasic acid anhydride used for synthesis of the half ester compound may be one containing a saturated group or one containing an unsaturated group. Specific examples of dibasic acid anhydrides include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride and itaconic anhydride.

In the reaction between the epoxy resin (a) and the vinyl group-containing monocarboxylic acid (b), preferably reaction is carried out with a proportion of 0.6-1.05 equivalents, and more preferably reaction is carried out with a proportion of 0.8-1.0 equivalents, of the vinyl group-containing monocarboxylic acid (b) with respect to one equivalent of epoxy groups in the epoxy resin (a).

The epoxy resin (a) and vinyl group-containing monocarboxylic acid (b) may be reacted after dissolution in an organic solvent. Examples of organic solvents include ketones such as methyl ethyl ketone and cyclohexanone, aromatic hydrocarbons such as toluene, xylene and tetramethylbenzene, glycol ethers such as methylcellosolve, butylcellosolve, methylcarbitol, butylcarbitol, propylene glycol monomethyl ether, dipropyleneglycol monoethyl ether, dipropyleneglycol diethyl ether and triethyleneglycol monoethyl ether, esters such as ethyl acetate, butyl acetate, butylcellosolve acetate and carbitol acetate, aliphatic hydrocarbons such as octane and decane, and petroleum-based solvents such as petroleum ether, petroleum naphtha, hydrogenated petroleum naphtha and solvent naphtha.

Also, a catalyst is preferably used to promote the reaction. Examples of catalysts that may be used include triethylamine, benzylmethylamine, methyltriethylammonium chloride, benzyltrimethylammonium chloride, benzyltrimethylammonium bromide, benzyltrimethylammonium iodide and triphenylphosphine. The amount of catalyst used is preferably 0.1-10 parts by mass with respect to 100 parts by mass as the total of the epoxy resin (a) and the vinyl group-containing monocarboxylic acid (b).

A polymerization inhibitor is also preferably used to prevent polymerization during the reaction. Examples of polymerization inhibitors include hydroquinone, methylhydroquinone, hydroquinonemonomethyl ether, catechol and pyrogallol. The amount of polymerization inhibitor used is preferably 0.01-1 part by mass with respect to 100 parts by mass as the total of the epoxy resin (a) and the vinyl group-containing monocarboxylic acid (b). The reaction temperature is preferably 60-150° C. and even more preferably 80-120° C.

If necessary, the vinyl group-containing monocarboxylic acid (b) may be used together with a phenol compound such as p-hydroxyphenethyl alcohol, or a polybasic acid anhydride such as trimellitic anhydride, pyromellitic anhydride, benzophenonetetracarboxylic anhydride or biphenyltetracarboxylic anhydride.

According to the invention, the (A) acid-modified vinyl group-containing epoxy resin is preferably a resin (A") obtained by reacting the resin (A') mentioned above with a polybasic acid anhydride (c).

In the resin (A"), it is assumed that the hydroxyl groups in the resin (A') (including the original hydroxyl group in the epoxy resin (a)) and the acid anhydride groups of the polybasic acid anhydride (c) are half-esterified.

The polybasic acid anhydride (c) used may be one containing a saturated group or one containing an unsaturated group. Specific examples for the polybasic acid anhydride (c) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride and itaconic anhydride.

In the reaction between the resin (A') and the polybasic acid anhydride (c), the polybasic acid anhydride (c) may be reacted at 0.1-1.0 equivalent with respect to one equivalent of hydroxyl groups in the resin (A'), to adjust the acid value of the acid-modified vinyl group-containing epoxy resin.

The acid value of the (A) acid-modified vinyl group-containing epoxy resin is preferably 30-150 mgKOH/g, more preferably 40-120 mgKOH/g and most preferably 50-100 mgKOH/g. If the acid value is less than 30 mgKOH/g, the solubility of the photosensitive resin composition in dilute alkali solutions will tend to be lowered. If it is greater than 150 mgKOH/g, the electrical characteristics of the cured film will tend to be reduced.

The temperature of the reaction between the resin (A') and polybasic acid anhydride (c) is preferably 60-120° C.

If necessary, a hydrogenated bisphenol A-type epoxy resin, for example, may be used therewith as a portion of the epoxy resin (a). In addition, a styrene-maleic acid-based resin, such as a hydroxyethyl acrylate-modified styrene-maleic anhydride copolymer or a hydroxyethyl acrylate-modified styrene-maleic anhydride copolymer, may be used therewith as part of the (A) acid-modified vinyl group-containing epoxy resin.

The content of component (A) in the photosensitive resin composition is preferably 5-60 mass %, more preferably 10-50 mass % and most preferably 15-40 mass %, based on the total solid mass of the photosensitive resin composition. If the content of component (A) is within this range, it will be possible to obtain a coating film with more excellent heat resistance, electrical characteristics and chemical resistance.

<(B) Phenol Compound>

Examples of the (B) phenol compound to be used for the invention include 2,6-di-t-butyl-4-methylphenol, 2,6-di-t-butyl-4-ethylphenol, 2,6-dicyclohexyl-4-methylphenol, 2,6-di-t-amyl-4-methylphenol, 2,6-di-t-octyl-4-n-propylphenol, 2,6-dicyclohexyl-4-n-octylphenol, 2-isopropyl-4-methyl-6-t-butylphenol, 2-t-butyl-2-ethyl-6-t-octylphenol, 2-isobutyl-4-ethyl-6-t-hexylphenol, 2-cyclohexyl-4-n-butyl-6-isopropylphenol, dl-α-tocopherol, t-butylhydroquinone, 2,2'-methylenebis(4-methyl-6-t-butylphenol), 4,4'-butylidenebis(3-methyl-6-t-butylphenol), 4-4'-thiobis(3-methyl-6-t-butylphenol), 2,2'-thiobis(4-methyl-6-t-butylphenol), 4,4'-methylenebis(2,6-di-t-butylphenol), 2,2'-methylenebis[6-(methylcyclohexyl)-p-cresol], 2,2'-ethylidenebis(4,6-di-t-butylphenol), 2,2'-butylidenebis(2-t-butyl-4-methylphenol), 2-t-butyl-6-(3-t-butyl-2-hydroxy-5-methylbenzyl)-4-methylphenyl acrylate, 2-[1-(2-hydroxy-3,5-di-t-pentylphenyl)ethyl]-4,6-di-t-pentylphenyl acrylate, 1,1,3-tris(2-methyl-4-hydroxy-5-t-butylphenyl)butane, triethyleneglycolbis[3-(3-t-butyl-5-methyl-4-hydroxyphenyl)propionate], 1,6-hexanediolbis[3-(3,5-di-t-butyl-4-hydroxyphenyl)propionate], 2,2-thiodiethylenebis[3-(3,5-di-t-butyl-4-hydroxyphenyl)propionate], N,N'-hexamethylenebis(3,5-di-t-butyl-4-hydroxy-hydrocinnamide), 3-5-di-t-butyl-4-hydroxybenzine phosphonatediethyl ester, tris(2,6-dimethyl-3-hydroxy-4-t-butylbenzyl)isocyanurate, tris(3,5-di-t-butyl-4-hydroxybenzyl)isocyanurate, tris[(3,5-di-t-butyl-4-hydroxyphenyl)propionyloxyethyl]isocyanurate, tris(4-t-butyl-2,6-dimethyl-3-hydroxybenzyl)isocyanurate, 2,4-bis(n-octylthio)-6-(4-hydroxy-3,5-di-t-butylanilino)-1,3,5-triazine, tetrakis[methylene-3-(3,5-di-t-butyl-4-hydroxyphenyl)propionate]methane, 2,2'-methylenebis(4-methyl-6-t-butylphenol)terephthalate, 1,3,5-trimethyl-2,4,6-tris(3,5-di-t-butyl-4-hydroxybenzyl)benzene, 3,9-bis[1,1-dimethyl 2-{β-(3-t-butyl-4-hydroxy-5-methylphenyl)propionyloxy}ethyl]-2,4,8,10-tetraoxaspiro[5,5]undecane, 2,2-bis[4-(2,3,5-di-t-butyl-4-hydroxyhydrocinnamoyloxy)]ethoxyphenyl]propane and β-(3,5-di-t-butyl-4-hydroxyphenyl)stearyl propionate ester.

Commercially available examples as phenol-based antioxidants for the (B) phenol compound include IRGANOX 1010 (Irganox 1010, product of Ciba Specialty Chemicals, Inc.), IRGANOX 1076 (Irganox 1076, product of Ciba Specialty Chemicals, Inc.), IRGANOX 1330 (Irganox 1330, product of Ciba Specialty Chemicals, Inc.), IRGANOX 3114 (Irganox 3114, product of Ciba Specialty Chemicals, Inc.), IRGANOX 3125 (Irganox 3125, product of Ciba Specialty Chemicals, Inc.), SUMILIZER BHT (Sumilizer BHT, product of Sumitomo Chemical Co., Ltd.), CYANOX 1790 (Cyanox 1790, product of Cytec, Inc.), SUMILIZER GA-80 (Sumilizer GA-80, product of Sumitomo Chemical Co., Ltd.), vitamin E (product of Eisai Co., Ltd.), ADEKASTAB AO-20, ADEKASTAB AO-30, ADEKASTAB AO-40, ADEKASTAB AO-50, ADEKASTAB AO-60, ADEKASTAB AO-80 and ADEKASTAB AO-330 (all products of Adeka Corp.).

These (B) phenol compounds may be used alone or in combinations of two or more.

Particularly preferred among them as the (B) phenol compound, from the viewpoint of allowing further improvement in the adhesive strength between the underfill material and cured film after PCT resistance testing, are phenol compounds represented by the following formula (1).

[Formula 1]

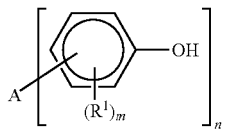

(1)

$R^1$ in formula (1) represents a $C_1$-$C_5$ alkyl group, and at least one $R^1$ is preferably a tert-butyl group. The letter m represents an integer of 1-4, and preferably 2. Also, the letter n represents an integer of 1-4, preferably 2-4 and more preferably 2-3. The letter A represents an organic group of n-valency, but from the viewpoint of further improving the soldering heat resistance, in addition to the adhesive strength between the underfill material and cured film after PCT resistance testing, it is preferably a divalent to tetravalent $C_1$-$C_5$ hydrocarbon group, a trivalent organic group represented by the following formula (2) or a trivalent organic group represented by the following formula (3), and more preferably it is a divalent to trivalent $C_1$-$C_5$ hydrocarbon group. Also, A in formula (1) especially preferably contains no ester bonds.

[Formula 2]

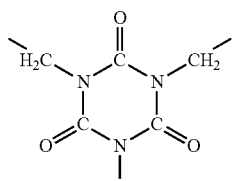

(2)

[Formula 3]

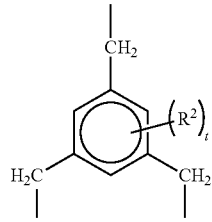

(3)

[In formula (3), $R^2$ represents a $C_1$-$C_5$ alkyl group and t represents an integer of 1-3.]

Most preferred among them as the (B) phenol compound, from the viewpoint of allowing further improvement in the soldering heat resistance and in the adhesive strength between the underfill material and cured film after PCT resistance testing, are compounds represented by the following formula (10).

[Formula 10]

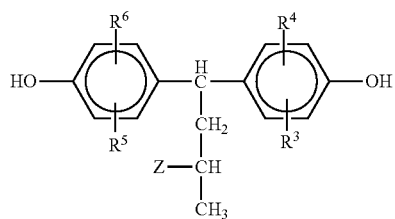

(10)

[In formula (10), $R^3$, $R^4$, $R^5$ and $R^6$ each independently represent a $C_1$-$C_5$ alkyl group, and Z represents hydrogen or an organic group represented by the following formula (11).]

[Formula 11]

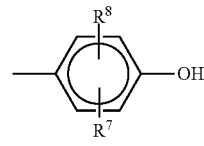

(11)

[In formula (11), $R^7$ and $R^8$ each independently represent a $C_1$-$C_5$ alkyl group.]

Examples of (B) phenol compounds that can improve soldering heat resistance and adhesive strength between the underfill material and cured film after PCT resistance testing include 2,2'-methylenebis(4-methyl-6-t-butylphenol), 4,4'-butylidenebis(3-methyl-6-t-butylphenol), 4,4'-thiobis(3-methyl-6-t-butylphenol), 2,2'-thiobis(4-methyl-6-t-butylphenol), 4,4'-methylenebis(2,6-di-t-butylphenol), 2,2'-methylenebis[6-(methylcyclohexyl)-p-cresol], 2,2'-ethylidenebis(4,6-di-t-butylphenol), 2,2'-butylidenebis(2-t-butyl-4-methylphenol), tris(3,5-di-t-butyl-4-hydroxybenzyl)isocyanurate, 1,3,5-trimethyl-2,4,6-tris(3,5-di-t-butyl-4-hydroxybenzyl)benzene, tris(2,6-dimethyl-3-hydroxy-4-t-butylbenzyl)isocyanurate, 4,4'-butylidenebis(3-methyl-6-t-butylphenol) and 1,1,3-tris(2-methyl-4-hydroxy-5-t-butylphenyl)butane. Particularly preferred among these are tris(3,5-di-t-butyl-4-hydroxybenzyl)isocyanurate, 1,3,5-trimethyl-2,4,6-tris(3,5-di-t-butyl-4-hydroxybenzyl)benzene, tris(2,6-dimethyl-3-hydroxy-4-t-butylbenzyl)isocyanurate, 1,1,3-tris(2-methyl-4-hydroxy-5-t-butylphenyl)butane and 4,4'-butylidenebis(3-methyl-6-t-butylphenol).

The content of component (B) in the photosensitive resin composition is preferably 0.01-10 mass %, more preferably 0.1-5 mass % and especially preferably 0.5-3 mass %, based on the total solid mass of the photosensitive resin composition. If the content of component (B) is less than 0.01 mass % it will tend to be difficult to obtain a sufficient improving effect for adhesive between the cured film and underfill material after PCT resistance testing, and if it exceeds 10 mass % the sensitivity will tend to be lowered.

<(C) Compound Having at Least One Ethylenically Unsaturated Group in Each Molecule>

The (C) compound having at least one ethylenically unsaturated group in each molecule is preferably a compound with a molecular weight of not greater than 1000, examples of which include hydroxyalkyl (meth)acrylates such as 2-hydroxyethyl (meth)acrylate and 2-hydroxypropyl (meth)acrylate; glycol mono or di(meth)acrylates such as ethylene glycol, methoxytetraethylene glycol and polyethylene glycol; (meth)acrylamides such as N,N-dimethyl (meth)acrylamide and N-methylol (meth)acrylamide; aminoalkyl (meth)acrylates such as N,N-dimethylaminoethyl (meth)acrylate; polyhydric (meth)acrylates of polyhydric alcohols such as hexanediol, trimethylolpropane, pentaerythritol, ditrimethylolpropane, dipentaerythritol and tris-hydroxyethyl isocyanurate, or their ethylene oxide or propylene oxide addition products; (meth)acrylates of ethylene oxide or propylene oxide addition products of phenols, such as phenoxyethyl (meth)acrylate and bisphenol A polyethoxy di(meth)acrylates; (meth)acrylates of glycidyl ethers such as glycerin diglycidyl ether, trimethylolpropane triglycidyl ether and triglycidyl isocyanurate; melamine (meth)acrylates, acrylamides, acrylonitriles, diacetone acrylamides, styrenes, vinyltoluenes and the like. These (C) compounds having at least one ethylenically unsaturated group in each molecule may be used alone or in combinations of two or more.

The content of component (C) in the photosensitive resin composition is preferably 1-30 mass %, more preferably 2-20 mass % and most preferably 3-10 mass %, based on the total solid mass of the photosensitive resin composition. If the content of component (C) is less than 1 mass % the photosensitivity will tend to be reduced and exposed sections will tend to elute during development, while if it exceeds 30 mass % the heat resistance will tend to be reduced.

<(D) Photopolymerization Initiator>

Examples for the (D) photopolymerization initiator include benzoins such as benzoin, benzoinmethyl ether and benzoinisopropyl ether; acetophenones such as acetophenone, 2,2-dimethoxy-2-phenylacetophenone, 2,2-diethoxy-2-phenylacetophenone, 1,1-dichloroacetophenone, 1-hydroxycyclohexylphenylketone, 2-benzyl-2-dimethylamino-1-(4-morpholinophenyl)-butanone-1,2-methyl-1-[4-(methylthio)phenyl]-2-morpholino-1-propanone and N,N-dimethylaminoacetophenone; anthraquinones such as 2-methylanthraquinone, 2-ethylanthraquinone, 2-tert-butylanthraquinone, 1-chloroanthraquinone, 2-amylanthraquinone and 2-aminoanthraquinone; thioxanthones such as 2,4-dimethylthioxanthone, 2,4-diethylthioxanthone, 2-chlorothioxanthone and 2,4-diisopropylthioxanthone; ketals such as acetophenonedimethylketal and benzyldimethylketal; benzophenones such as benzophenone, methylbenzophenone, 4,4'-dichlorobenzophenone, 4,4'-bis(diethylamino)benzophenone, Michler's ketone and 4-benzoyl-4'-methyldiphenyl sulfide; 2,4,5-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer and 2-(2,4-dimethoxyphenyl)-4,5-diphenylimidazole dimer; acridines such as 9-phenylacridine and 1,7-bis(9,9'-acridinyl)heptane; acylphosphine oxides such as 2,4,6-trimethylbenzoyldiphenylphosphine oxide; and oxime esters such as 1,2-octanedione-1-[4-(phenylthio)phenyl]-2-(O-benzoyloxime), 1-[9-ethyl-6-(2-methylbenzoyl)-9H-carbazol-3-yl]ethanone 1-(O-acetyloxime) and 1-phenyl-1,2-propanedione-2[O-(ethoxycarbonyl)oxime]. These (D) photopolymerization initiators may be used alone or in combinations of two or more.

Also, (D) photopolymerization initiator aids including tertiary amines such as N,N-dimethylaminobenzoicacid ethyl ester, N,N-dimethylaminobenzoicacid isoamyl ester, pentyl-4-dimethyl aminobenzoate, triethylamine and triethanolamine may be used alone or in combinations of two or more.

The content of component (D) in the photosensitive resin composition is preferably 0.5-20 mass %, more preferably 1-10 mass % and especially preferably 2-6 mass %, based on the total solid mass of the photosensitive resin composition. If the content of component (D) is less than 0.5 mass % the exposed sections will tend to elute during development, while if it exceeds 20 mass % the heat resistance will tend to be reduced.

<(E) Inorganic Fine Particles>

Examples of (E) inorganic fine particles that may be used include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO.TiO_2$), barium carbonate ($BaCO_3$), magnesium carbonate, aluminum oxide, aluminum hydroxide, magnesium hydroxide, lead titanate ($PbO.TiO_2$), lead zirconate titanate (PZT), lead lanthanum zirconate titanate (PLZT), gallium oxide ($Ga_2O_3$), spinel ($MgO.Al_2O_3$), mullite ($3Al_2O_3.2SiO_2$), cordierite ($2MgO.2Al_2O_3/5SiO_2$), talc ($3 MgO.4SiO_2.H_2O$), aluminum titanate ($TiO_2$—$Al_2O_3$), yttria-containing zirconia ($Y_2O_3$—$ZrO_2$), barium silicate ($BaO.8SiO_2$), boron nitride (BN), calcium carbonate ($CaCO_3$), barium sulfate ($BaSO_4$), calcium sulfate ($CaSO_4$), zinc oxide (ZnO), magnesium titanate ($MgO.TiO_2$), hydrotalcite, mica, calcined kaolin, carbon (C), and the like. These (E) inorganic fine particles may be used alone or in combinations of two or more.

The content of component (E) in the photosensitive resin composition is preferably 15-80 mass %, more preferably 20-70 mass %, especially preferably 25-50 mass % and most preferably 30-45 mass %, based on the total solid mass of the photosensitive resin composition. If the content of component (E) is within this range, it will be possible to further improve the film strength, heat resistance, insulating reliability, thermal shock resistance and resolution.

The (E) inorganic fine particles have a maximum particle size of preferably 0.1-20 μm, more preferably 0.1-10 μm, particularly preferably 0.1-5 μm and most preferably 0.1-1 μm. If the maximum particle size exceeds 20 μm the insulating reliability will tend to be impaired.

Among (E) inorganic fine particles, it is preferred to use silica fine particles from the viewpoint of allowing improvement in heat resistance, while it is preferred to use barium sulfate fine particles from the viewpoint of allowing improvement in soldering heat resistance, HAST properties (insulating reliability), crack resistance (thermal shock resistance) and adhesive strength between the underfill material and cured film after PCT resistance testing. Barium sulfate fine particles are preferably surface treated with an alumina and/or organosilane-based compound, from the viewpoint of allowing an improved anti-aggregation effect.

The elemental composition of aluminum on the surface of barium sulfate fine particles that have been surface treated with an alumina and/or organosilane-based compound is preferably 0.5-10 atomic percent, more preferably 1-5 atomic percent and especially preferably 1.5-3.5 atomic percent. Also, the elemental composition of silicon on the surface of the barium sulfate fine particles is preferably 0.5-10 atomic percent, more preferably 1-5 atomic percent and especially preferably 1.5-3.5 atomic percent. Also, the elemental composition of carbon on the surface of the barium sulfate fine particles is preferably 10-30 atomic percent, more preferably 15-25 atomic percent and especially preferably 18-23 atomic percent. These elemental compositions can be measured using XPS.

When barium sulfate is used, the content is preferably 10-60 mass %, more preferably 15-50 mass %, particularly preferably 20-40 mass % and most preferably 25-35 mass %, based on the total solid mass of the photosensitive resin composition. If the content of barium sulfate fine particles is within this range, it will be possible to further improve the soldering heat resistance and the adhesive strength between the underfill material and cured film after PCT resistance testing.

A commercially available example of barium sulfate fine particles that have been surface treated with an alumina and/or organosilane-based compound is NanoFine BFN40DC (trade name of Nippon Solvay, KK).

The photosensitive resin composition of the invention may also contain (F) a curing agent, (H) an epoxy resin curing agent and/or (G) an elastomer, in addition to components (A) to (E) mentioned above. Each of these components will now be explained.

<(F) Curing Agent>

The (F) curing agent is preferably a compound that itself cures by heat or ultraviolet rays, or a compound that cures upon reaction with the carboxyl or hydroxyl groups of the (A) acid-modified vinyl group-containing epoxy resin, under heat or ultraviolet rays. By using (F) a curing agent it is possible to further improve the heat resistance, adhesion and chemical resistance of the cured film formed from the photosensitive resin composition.

Examples for the (F) curing agent include thermosetting compounds such as epoxy compounds, melamine compounds, urea compounds, oxazoline compounds and block-type isocyanate. Examples of epoxy compounds include bisphenol A-type epoxy resins, bisphenol F-type epoxy resins, hydrogenated bisphenol A-type epoxy resins, brominated bisphenol A-type epoxy resins, novolac-type epoxy resins, bisphenol S-type epoxy resins, biphenyl-type epoxy resins, naphthalene-type epoxy resins, dicyclo-type epoxy resins, hydantoin-type epoxy resins, or heterocyclic epoxy resins such as triglycidyl isocyanurate, and bixylenol-type epoxy resins. Examples of melamine compounds include triaminotriazine, hexamethoxymelamine, hexabutoxylated melamine. Examples of urea compounds include dimethylolurea and the like.

From the viewpoint of allowing further improvement in the heat resistance of the cured film, the (F) curing agent preferably contains an epoxy compound (epoxy resin) and/or a block-type isocyanate, and more preferably it also contains both an epoxy compound and a block-type isocyanate.

As block-type isocyanates there may be used addition reaction products of polyisocyanate compounds and isocyanate blocking agents. Examples of such polyisocyanate compounds include polyisocyanate compounds such as tolylene diisocyanate, xylylene diisocyanate, phenylene diisocyanate, naphthylene diisocyanate, bis(isocyanatomethyl)cyclohexane, tetramethylene diisocyanate, hexamethylene diisocyanate, methylene diisocyanate, trimethylhexamethylene diisocyanate and isophorone diisocyanate, as well as their adducts, biurets, and isocyanurates.

Examples of isocyanate blocking agents include phenol-based blocking agents such as phenol, cresol, xylenol, chlorophenol and ethylphenol; lactam-based blocking agents such as ε-caprolactam, δ-valerolactam, γ-butyrolactam and β-propiolactam; active methylene-based blocking agents such as ethyl acetoacetate and acetylacetone; alcohol-based blocking agents such as methanol, ethanol, propanol, butanol, amyl alcohol, ethyleneglycol monomethyl ether, ethyleneglycol monoethyl ether, ethyleneglycol monobutyl ether, diethyleneglycol monomethyl ether, propyleneglycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethylketoxime, diacetylmonooxime and cyclohexaneoxime; mercaptane-based blocking agents such as butylmercaptane, hexylmercaptane, t-butylmercaptane, thiophenol, methylthiophenol and ethylthiophenol; acid amide-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

These (F) curing agents may be used alone or in combinations of two or more. When (F) a curing agent is used, its content is preferably 2-40 mass %, more preferably 3-30 mass % and especially preferably 5-20 mass %, based on the total solid mass of the photosensitive resin composition. By limiting the (F) curing agent content to within the range of 2-40 mass %, it is possible to maintain a satisfactory developing property while further improving the heat resistance of the formed cured film.

<(G) Elastomer>

A (G) elastomer may be suitably used when the photosensitive resin composition of the invention is to be used as a semiconductor package board. By adding a (G) elastomer to the photosensitive resin composition of the invention it is possible to eliminate the problem of cure shrinkage of the (A) acid-modified vinyl group-containing epoxy resin due to progress of crosslinking reaction (curing reaction) by ultraviolet rays or heat, which exerts strain (internal stress) in the resin and lowers the flexibility and adhesion.

Examples of (G) elastomers include styrene-based elastomers, olefin-based elastomers, urethane-based elastomers, polyester-based elastomers, polyamide-based elastomers, acrylic elastomers and silicone-based elastomers. These (G) elastomers are composed of a hard segment component and a soft segment component, generally with the former contributing to heat resistance and strength and the latter contributing to flexibility and toughness.

Styrene-based elastomers include styrene-butadiene-styrene block copolymer, styrene-isoprene-styrene block copolymer, styrene-ethylene-butylene-styrene block copolymer and styrene-ethylene-propylene-styrene block copolymer.

The components constituting the styrene-based elastomers may be styrene or styrene derivatives such as α-methylstyrene, 3-methylstyrene, 4-propylstyrene or 4-cyclohexylstyrene. More specifically, there may be used TUFPRENE, SOLPRENE T, ASAPRENE T, TUFTEC (all products of Asahi Kasei Corp.), elastomer AR (product of Aron Kasei Co., Ltd.), KRATON G, CALIFLEX (both products of Shell in Japan), JSR-TR, TSR-SIS, DYNARON (all products of JSR Corp.), DENKA STR (product of Denki Kagaku Kogyo Co., Ltd.), QUINTAC (product of Zeon Corp.), TPE-SB Series (product of Sumitomo Chemical Co., Ltd.), RABALON (product of Mitsubishi Chemical Corp.), SEPTON, HYBRAR (both products of Kuraray Co., Ltd.), SUMIFLEX (product of Sumitomo Bakelite Co., Ltd.), LEOSTOMER and ACTYMER (both products of Riken Vinyl Industry Co., Ltd.).

An olefin-based elastomer is a $C_2$-$C_{20}$ α-olefin copolymer of ethylene, propylene, 1-butene, 1-hexene, 4-methyl-pentene or the like. Specific examples thereof include ethylene-propylene copolymer (EPR), ethylene-propylene-diene copolymer (EPDM), copolymers of $C_2$-$C_{20}$ non-conjugated dienes such as dicyclopentadiene, 1,4-hexadiene, cyclooctadiene, methylenenorbornane, ethylidenenorbornane, butadiene and isoprene with α-olefins, and carboxy-modified NBR obtained by copolymerizing methacrylic acid with butadiene-acrylonitrile copolymer. More specifically, these include ethylene-α-olefin copolymer rubber, ethylene-α-olefin-non-conjugated diene copolymer rubber, propylene-α-olefin copolymer rubber, and butene-α-olefin copolymer rubber. Even more specifically, there may be used MILASTOMER (product of Mitsui Petroleum Chemical Co., Ltd.), EXACT (product of Exxon Chemical Co.), ENGAGE (product of The Dow Chemical Company), the hydrogenated styrene-butadiene rubber DYNABON HSBR (product of JSR Corp.), butadiene-acrylonitrile copolymers of the NBR Series (product of JSR Corp.) or double-end carboxyl group-modified butadiene-acrylonitrile copolymers of the XER Series (product of JSR Corp.) or the epoxidized polybutadienes with partially epoxidized polybutadiene, such as BF-1000 (product of Nippon Soda Co., Ltd.) and PB-3600 (product of Daicel Chemical Industries, Ltd.).

A urethane-based elastomer is composed of the structural units of a hard segment comprising a low-molecular glycol and a diisocyanate, and a soft segment comprising a high-molecular (long chain) diol and a diisocyanate.

Examples of low-molecular glycols that may be used include short chain diols such as ethylene glycol, propylene glycol, 1,4-butanediol and bisphenol A. The number-average molecular weight of the short chain diol is preferably 48-500.

Examples of high-molecular (long chain) diols include polypropylene glycol, polytetramethylene oxide, poly(1,4-butylene adipate), poly(ethylene•1,4-butylene adipate), poly-caprolactone, poly(1,6-hexylene carbonate) and poly(1,6-hexylene•neopentylene adipate). The number-average molecular weight of the high-molecular (long chain) diol is preferably 500-10,000.

Specific examples of urethane-based elastomers include PANDEX T-2185, T-2983N (products of Dainippon Ink & Chemicals, Inc.) and SILACTRAN E790.

Polyester-based elastomers include compounds obtained by polycondensation of dicarboxylic acids or their derivatives and diol compounds or their derivatives.

Specific examples of dicarboxylic acids include aromatic dicarboxylic acids such as terephthalic acid, isophthalic acid and naphthalenedicarboxylic acid, as well as these aromatic dicarboxylic acids wherein hydrogens of the aromatic nucleus have been replaced by methyl, ethyl, phenyl or the like, $C_2$-$C_{20}$ aliphatic dicarboxylic acids such as adipic acid, sebacic acid and dodecanedicarboxylic acid, and alicyclic dicarboxylic acids such as cyclohexanedicarboxylic acid. These compounds may be used alone or in combinations of two or more different ones.

Specific examples of diol compounds include aliphatic diols and alicyclic diols such as ethylene glycol, 1,3-propanediol, 1,4-butanediol, 1,6-hexanediol, 1,10-decanediol and 1,4-cyclohexanediol, or dihydric phenols represented by the following formula (12).

[Formula 12]

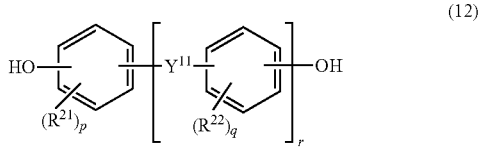

(12)

[In the formula, $Y^{11}$ represents a single bond, $C_1$-$C_{10}$ alkylene group, $C_4$-$C_8$ cycloalkylene group, —O—, —S— or —$SO_2$—, $R^{21}$ and $R^{22}$ each represent a halogen atom or $C_1$-$C_{12}$ alkyl group, p and q each represent an integer of 0-4, and r represents 0 or 1.]

Specific examples of dihydric phenols represented by formula (12) include bisphenol A, bis-(4-hydroxyphenyl)methane, bis-(4-hydroxy-3-methylphenyl)propane and resorcin. These compounds may be used alone or in combinations of two or more different ones.

There may also be used a multiblock copolymer wherein the aromatic polyester (for example, polybutylene terephthalate) portion is used as the hard segment component and the aliphatic polyester (for example, polytetramethylene glycol) portion is used as the soft segment component. Various grades exist depending on the types, proportion and molecular weights of the hard segment and soft segment. Specific examples include HYTREL (product of DuPont-Toray Co., Ltd.), PELPRENE (product of Toyobo, Ltd.) and ESPEL (product of Hitachi Chemical Co., Ltd.).

Polyamide-based elastomers are largely classified into two different types, polyether block amide-types and polyether ester block amide-types, which employ a polyamide as the hard segment and a polyether or polyester as the soft segment.

Polyamide-6, 11, 12 or the like may be used as the polyamide. Polyoxyethylene, polyoxypropylene, polytetramethylene glycol or the like may be used as the polyether. Specifically, there may be used UBE Polyamide Elastomer (product of Ube Industries, Ltd.), DAIAMID (product of Daicel-Hüls, Ltd.), PEBAX (product of Toray Co., Ltd.), GRILON ELY (product of EMS Japan), NOPAMID (product of Mitsubishi Chemical Corp.) and GRELAX (product of Dainippon Ink & Chemicals, Inc.).

Acrylic elastomers are composed mainly of acrylic acid esters, and ethyl acrylate, butyl acrylate, methoxyethyl acrylate, ethoxyethyl acrylate or the like may be used. Also, glycidyl methacrylate, allyl glycidyl ether or the like may be used as a crosslinking point monomer. Acrylonitrile or ethylene may also be copolymerized. Specifically, acrylonitrile-butyl acrylate copolymer, acrylonitrile-butyl acrylate-ethyl acrylate copolymer, acrylonitrile-butyl acrylate-glycidyl methacrylate copolymer, or the like may be used.

Silicone-based elastomers are composed mainly of organopolysiloxanes, and they are classified into polydimethylsiloxane-based, polymethylphenylsiloxane-based and polydiphenylsiloxane-based types. Some are partially modified with vinyl or alkoxy groups. Specific examples include the KE Series (product of Shin-Etsu Chemical Co., Ltd.), SE Series, CY Series and SH Series (all products of Toray Dow Corning Silicone Co., Ltd.).

Rubber-modified epoxy resins may also be used instead of the aforementioned elastomers. Rubber-modified epoxy resins are obtained, for example, by modifying all or a portion of the epoxy groups of a bisphenol F-type epoxy resin, bisphenol A-type epoxy resin, salicylaldehyde-type epoxy resin, phenol-novolac-type epoxy resin or cresol-novolac-type epoxy resin mentioned above with a double-end carboxylic acid-modified butadiene-acrylonitrile rubber or terminal amino-modified silicone rubber. Preferred among these elastomers, from the viewpoint of shear adhesion, are double-end carboxyl group-modified butadiene-acrylonitrile copolymers, hydroxyl-containing polyester-based elastomer ESPEL (ESPEL 1612 and 1620, products of Hitachi Chemical Co., Ltd.) and epoxidized polybutadiene. Particularly preferred are elastomers that are liquid at room temperature.

When a (G) elastomer is used, its content is preferably 1-20 mass %, more preferably 2-15 mass % and particularly preferably 3-10 mass %, based on the total solid mass of the photosensitive resin composition. If the (G) elastomer content is within the range of 1-20 mass %, it will be possible to maintain satisfactory developing properties while further improving the thermal shock resistance and the adhesive strength between the underfill material and cured film. Furthermore, when used in a thin-film board, it will be possible to reduce warping of the thin-film board.

An (H) epoxy resin curing agent may also be added to the photosensitive resin composition of the invention, for the purpose of further improving the properties including the heat resistance, adhesion and chemical resistance of the formed cured film.

Specific examples of such (H) epoxy resin curing agents include imidazole derivatives such as 2-methylimidazole, 2-ethyl-4-methylimidazole, 1-benzyl-2-methylimidazole, 2-phenylimidazole and 2-phenyl-4-methyl-5-hydroxymethylimidazole; guanamines such as acetoguanamine and benzoguanamine; polyamines such as diaminodiphenylmethane, m-phenylenediamine, m-xylenediamine, diaminodiphenylsulfone, dicyandiamide, urea, urea derivatives, melamines and polybasic hydrazides; organic acid salt and/or epoxy adducts of the foregoing; boron trifluoride amine complex; triazine derivatives such as ethyldiamino-S-triazine, 2,4-diamino-S-triazine and 2,4-diamino-6-xylyl-S-triazine; tertiary amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine and m-aminophenol; polyphenols such as polyvinylphenol, polyvinylphenol bromide, phenol-novolac and alkylphenol-novolac; organic phosphines such as tributylphosphine, triphenylphosphine and tris-2-cyanoethylphosphine; phosphonium salts such as tri-n-butyl (2,5-dihydroxyphenyl) phosphonium bromide and hexadecyltributylphosphonium chloride; quaternary ammonium salts such as benzyltrimethylammonium chloride and phenyltributylammonium chloride; anhydrides of the foregoing polybasic acids; and diphenyliodonium tetrafluoroborate, triphenylsulfonium hexafluoroantimonate, 2,4,6-triphenylthiopyrylium hexafluorophosphate, and the like. Such (H) epoxy resin curing agents may be used alone or in combinations of two or more.

When an (H) epoxy resin curing agent is used, its content is preferably 0.01-20 mass % and more preferably 0.1-10 mass %, based on the total solid weight of the photosensitive resin composition.

An (I) thermoplastic resin may also be added to the photosensitive resin composition of the invention, to further improve the flexibility of the cured film.

Examples for the (I) thermoplastic resin include acrylic resins, urethane resins and the like. When an (I) thermoplastic resin is added, its content is preferably 1-30 mass % and more preferably 5-20 mass %, based on the total solid weight of the photosensitive resin composition.

The photosensitive resin composition of the invention may also contain, as necessary, various additives that are known and commonly used, including organic fine particles such as melamine and organic bentonite, known coloring agents such as phthalocyanine blue, phthalocyanine green, iodine green, diazo yellow, crystal violet, titanium oxide, carbon black and naphthalene black, polymerization inhibitors such as hydroquinone, methylhydroquinone, hydroquinonemonomethyl ether, catechol and pyrogallol, thickeners such as bentone and montmorillonite, silicone-based, fluorine-based and vinyl resin-based antifoaming agents, silane coupling agents, diluents, and the like. There may also be added flame retardants such as brominated epoxy compounds, acid-modified brominated epoxy compounds, antimony compounds, and phosphorus-based compounds such as phosphate compounds, aromatic condensed phosphoric acid esters and halogen-containing condensed phosphoric acid esters.

Organic solvents, for example, may be used as diluents. Examples of organic solvents include ketones such as ethyl methyl ketone and cyclohexanone, aromatic hydrocarbons such as toluene, xylene and tetramethylbenzene, glycol ethers such as methylcellosolve, butylcellosolve, methylcarbitol, butylcarbitol, propylene glycol monomethyl ether, dipropyleneglycol monoethyl ether, dipropyleneglycol diethyl ether and triethyleneglycol monoethyl ether, esters such as ethyl acetate, butyl acetate, butylcellosolve acetate and carbitol acetate, aliphatic hydrocarbons such as octane and decane, and petroleum-based solvents such as petroleum ether, petroleum naphtha, hydrogenated petroleum naphtha and solvent naphtha. These diluents may be used alone or in combinations of two or more. When a diluent is used, its content may be appropriately adjusted from the viewpoint of the coatability of the photosensitive resin composition.

The photosensitive resin composition of the invention may be obtained by uniformly kneading and mixing each of the aforementioned components using a roll mill, bead mill or the like.

The photosensitive resin composition of the invention may be used for image formation and cured film formation in the following manner, for example.

Specifically, a copper-clad laminate is coated by a method such as screen printing, spraying, roll coating, curtain coating or electrostatic coating to a film thickness of 10-200 μm and the coating film is then dried at 60-110° C., after which a negative film is contacted directly therewith (or indirectly through a transparent film) and active light (such as ultraviolet rays) is irradiated at an exposure dose of preferably 10-1,000 mJ/cm$^2$, and then the unexposed sections are dissolved off with a dilute aqueous alkali solution or organic solvent (development). The exposed sections are subsequently cured to a sufficient degree by post-exposure (ultraviolet ray exposure) and/or post-heating, to obtain a cured film. The post-exposure is preferably carried out at an exposure dose of 1-5 J/cm$^2$, for example, and the post-heating is preferably carried out at 100-200° C. for 30 minutes to 12 hours.

The photosensitive resin composition of the invention may also be layered with a support as a photosensitive element. The thickness of the layer comprising the photosensitive resin composition is preferably 10-100 μm. The support is preferably a film with a thickness of 5-100 μm, such as polyethylene terephthalate. The layer comprising the photosensitive resin composition is preferably formed by coating and drying a solution of the photosensitive resin composition on a support film.

EXAMPLES

The present invention will now be explained in greater detail based on examples and comparative examples, with the understanding that the invention is in no way limited to the examples.

Synthesis Example 1

Production of Acid-Modified Vinyl Group-Containing Epoxy Resin (A-1)

There were charged 350 parts by mass of a bisphenol F-novolac-type epoxy resin having the repeating unit represented by formula (8) above ($R^{14}$=hydrogen, $Y^6$ and $Y^7$=glycidyl group) (EXA-7376, product of Dainippon Ink and Chemicals, Inc.), 70 parts by mass of acrylic acid, 0.5 part by mass of methylhydroquinone and 120 parts by mass of carbitol acetate, the mixture was heated to 90° C. and stirred for reaction, and the mixture was completely dissolved. The obtained solution was then cooled to 60° C., 2 parts by mass of triphenylphosphine was added, and the mixture was heated to 100° C. for reaction until the acid value of the solution reached 1 mgKOH/g. To the reacted solution there were added 98 parts by mass of tetrahydrophthalic anhydride (THPAC) and 85 parts by mass of carbitol acetate, and after heating to 80° C. and reacting for approximately 6 hours, the mixture was cooled to obtain a solution with a solid portion concentration of 73 mass %, having a THPAC-modified bisphenol F-type novolac-epoxy acrylate as component (A) (hereinafter referred to as "acid-modified vinyl group-containing epoxy resin (A-1)").

Synthesis Example 2

Production Example for Acid-Modified Vinyl Group-Containing Epoxy Resin (A-2)

There were charged 382 parts by mass of a cresol-novolac-type epoxy resin represented by formula (4) above ($R^{11}$=hydrogen, $Y^1$=glycidyl group) (ESCN-195, product of Sumitomo Chemical Co., Ltd.), 90 parts by mass of acrylic acid, 0.5 part by mass of methylhydroquinone and 120 parts by mass of carbitol acetate, the mixture was heated to 90° C. and stirred for reaction, and the mixture was completely dissolved. The obtained solution was then cooled to 60° C., 2 parts by mass of triphenylphosphine was added, and the mixture was heated to 100° C. for reaction until the acid value of the solution reached below 1 mgKOH/g. To the reacted solution there were added 100 parts by mass of tetrahydrophthalic anhydride (THPAC) and 85 parts by mass of carbitol acetate, and after heating to 80° C. and reacting for approximately 6 hours, the mixture was cooled to obtain a solution with a solid portion concentration of 75%, having a THPAC-modified cresol-novolac-type epoxy acrylate as component (A) (hereinafter referred to as "acid-modified vinyl group-containing epoxy resin (A-2)").

Examples 1-10, Comparative Examples 1-11

Each of the materials listed in Tables 1 and 2 was mixed in the amounts also listed in the tables (units: parts by mass) and then kneaded with a triple roll mill, and carbitol acetate was added to a solid concentration of 70 mass % to obtain a photosensitive resin composition. The contents of the materials in Tables 1 and 2 are represented as solid portion contents.

TABLE 1

| Component | Material | Example 1 | Example 2 | Example 3 | Example 4 | Example 5 | Example 6 | Example 7 | Example 8 | Example 9 | Example 10 |
|---|---|---|---|---|---|---|---|---|---|---|---|
| (A) | Acid-modified vinyl group-containing epoxy resin (A-1)*[1] | 45 | 45 | 45 | 45 | — | 45 | 45 | 45 | 45 | 45 |
|  | Acid-modified vinyl group-containing epoxy resin (A-2)*[2] | — | — | — | — | 45 | — | — | — | — | — |
| (G) | PB-3600*[3] | — | — | 5 | — | 5 | — | — | — | — | — |
| (F) | EPIKOTE 828*[4] | 12 | 12 | 12 | 12 | 12 | 12 | 12 | 12 | 12 | 12 |
| (C) | KAYARAD DPHA*[5] | 7 | 7 | 7 | 7 | 7 | 7 | 7 | 7 | 7 | 7 |
| (D) | IRGACURE 907*[6] | 4.5 | 4.5 | 4.5 | 4.5 | 4.5 | 4.5 | 4.5 | 4.5 | 4.5 | 4.5 |
|  | KAYACURE DETX-S*[7] | 0.8 | 0.8 | 0.8 | 0.8 | 0.8 | 0.8 | 0.8 | 0.8 | 0.8 | 0.8 |
| (B) | AO-20*[8] | 2 | — | — | — | — | — | — | — | — | — |
|  | AO-30*[9] | — | 2 | — | — | — | — | — | — | — | — |
|  | AO-40*[10] | — | — | 2 | — | 2 | — | — | 2 | 2 | 2 |
|  | AO-50*[11] | — | — | — | 2 | — | — | — | — | — | — |
|  | AO-80*[12] | — | — | — | — | — | 2 | — | — | — | — |
|  | YOSHINOX BHT*[13] | — | — | — | — | — | — | 2 | — | — | — |
| Coloring agent | Phthalocyanine Green | 1.5 | 1.5 | 1.5 | 1.5 | 1.5 | 1.5 | 1.5 | 1.5 | 1.5 | 1.5 |
| Organic fine particles | Melamine | 4 | 4 | 4 | 4 | 4 | 4 | 4 | 4 | 4 | 4 |
| (E) | FLB-1*[21] | 16 | 16 | 16 | 16 | 16 | 16 | 16 | 16 | 16 | 16 |
|  | NanoFine BFN40DC*[22] | 40 | 40 | 40 | 40 | 40 | 40 | 40 | 40 | 20 | 60 |

TABLE 2

| Component | Material | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 | Comp. Ex. 10 | Comp. Ex. 11 |
|---|---|---|---|---|---|---|---|---|---|---|---|---|
| (A) | Acid-modified vinyl group-containing epoxy resin (A-1)*[1] | 45 | 45 | 45 | 45 | 45 | 45 | 45 | 45 | 45 | — | 101 |
|  | Acid-modified vinyl group-containing epoxy resin (A-2)*[2] | — | — | — | — | — | — | — | — | — | 45 | — |
| (G) | PB-3600*[3] | — | — | — | — | — | — | — | — | 5 | — | — |
| (F) | EPIKOTE 828*[4] | 12 | 12 | 12 | 12 | 12 | 12 | 12 | 12 | 12 | 12 | 12 |
| (C) | KAYARAD DPHA*[5] | 7 | 7 | 7 | 7 | 7 | 7 | 7 | 7 | 7 | 7 | 7 |
| (D) | IRGACURE 907*[6] | 4.5 | 4.5 | 4.5 | 4.5 | 4.5 | 4.5 | 4.5 | 4.5 | 4.5 | 4.5 | 4.5 |
|  | KAYACURE DETX-S*[7] | 0.8 | 0.8 | 0.8 | 0.8 | 0.8 | 0.8 | 0.8 | 0.8 | 0.8 | 0.8 | 0.8 |
| (B)-substituting component | PEP-4C*[14] | 2 | — | — | — | — | — | — | — | — | — | — |
|  | PEP-8*[15] | — | 2 | — | — | — | — | — | — | — | — | — |
|  | PEP-24G*[16] | — | — | 2 | — | — | — | — | — | — | — | — |
|  | HP-10*[17] | — | — | — | 2 | — | — | — | — | — | — | — |
|  | AO-23*[18] | — | — | — | — | 2 | — | — | — | — | — | — |
|  | AO-412S*[19] | — | — | — | — | — | 2 | — | — | — | — | — |
|  | AO-503A*[20] | — | — | — | — | — | — | 2 | — | — | — | — |
| (B) | YOSHINOX BHT*[13] | — | — | — | — | — | — | — | — | — | — | 2 |
| Coloring agent | Phthalocyanine Green | 1.5 | 1.5 | 1.5 | 1.5 | 1.5 | 1.5 | 1.5 | 1.5 | 1.5 | 1.5 | 1.5 |

TABLE 2-continued

| Component | Material | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 | Comp. Ex. 10 | Comp. Ex. 11 |
|---|---|---|---|---|---|---|---|---|---|---|---|---|
| Organic fine particles (E) | Melamine | 4 | 4 | 4 | 4 | 4 | 4 | 4 | 4 | 4 | 4 | 4 |
| | FLB-1*[21] | 16 | 16 | 16 | 16 | 16 | 16 | 16 | 16 | 16 | 16 | — |
| | NanoFine BFN40DC*[22] | 40 | 40 | 40 | 40 | 40 | 40 | 40 | 40 | 40 | 40 | — |

The details regarding the materials listed in Tables 1 and 2 are as follows.

*[1](Acid-modified vinyl group-containing epoxy resin (A-1)): THPAC-modified bisphenol F-type novolac-epoxy acrylate prepared in Synthesis Example 1,
*[2](Acid-modified vinyl group-containing epoxy resin (A-2)): THPAC-modified cresol-novolac-type epoxy acrylate,
*[3](PB-3600): epoxidized polybutadiene (trade name of Daicel Chemical Industries, Ltd.),
*[4](EPIKOTE828): Bisphenol A-type epoxy resin (trade name of Japan Epoxy Resins Co., Ltd.),
*[5](KAYARAD DPHA): Dipentaerythritol hexaacrylate (trade name of Nippon Kayaku Co., Ltd.),
*[6](IRGACURE 907): 2-Methyl-[4-(methylthio)phenyl]morpholino-1-propanone (trade name of Ciba Specialty Chemicals Co., Ltd.),
*[7](KAYACURE DETX-S): 2,4-Diethylthioxanthone (trade name of Nippon Kayaku Co., Ltd.),
*[8](AO-20): Phenol-based antioxidant (trade name of Adeka Corp.), compound represented by formula (I) below,
*[9](AO-30): Phenol-based antioxidant (trade name of Adeka Corp.), 1,1,3-tris(2-methyl-4-hydroxy-5-t-butylphenyl)butane represented by formula (II) below,
*[10](AO-40): Phenol-based antioxidant (trade name of Adeka Corp.), 4,4'-butylidenebis(3-methyl-6-t-butylphenol) represented by formula (III) below,
*[11](AO-50): Phenol-based antioxidant (trade name of Adeka Corp.), stearyl-β-(3,5-di-t-butyl-4-hydroxyphenyl)propionate represented by formula (IV) below,
*[12](AO-80): Phenol-based antioxidant (trade name of Adeka Corp.), compound represented by formula (V) below,
*[13](YOSHINOX BHT): Phenol-based antioxidant (trade name of Yoshitomi Pharmaceutical Industries, Ltd.), dibutylhydroxytoluene represented by formula (VI) below,
*[14](PEP-4C): Phosphorus-based antioxidant (trade name of Adeka Corp.), compound represented by formula (VII) below,
*[15](PEP-8): Phosphorus-based antioxidant (trade name of Adeka Corp.), distearylpentaerythritol diphosphite represented by formula (VIII) below,
*[16](PEP-24G): Phosphorus-based antioxidant (trade name of Adeka Corp.), compound represented by formula (IX) below,
*[17](HP-10): Phosphorus-based antioxidant (trade name of Adeka Corp.), compound represented by formula (X) below,
*[18](AO-23): Sulfur-based antioxidant (trade name of Adeka Corp.), compound represented by formula (XI) below,
*[19](AO-412S): Sulfur-based antioxidant (trade name of Adeka Corp.), compound represented by formula (XII) below,
*[20](AO-503A): Sulfur-based antioxidant (trade name of Adeka Corp.), compound represented by formula (XIII) below,
*[21](FLB-1): Silica fine particles (trade name of Tatsumori, Ltd.),
*[22](NanoFine BFN40DC): Barium sulfate fine particles (trade name of Nippon Solvay, KK).

[Formula I]

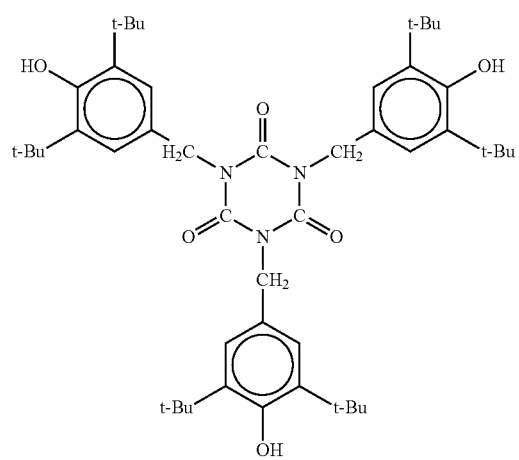

(I)

[Formula II]

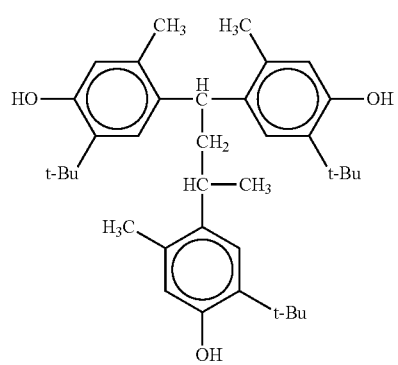

(II)

[Formula III]

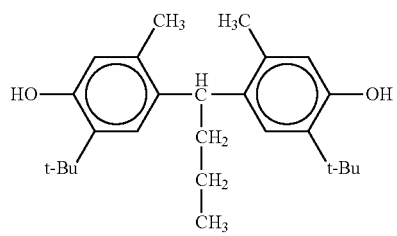

(III)

[Formula IV]

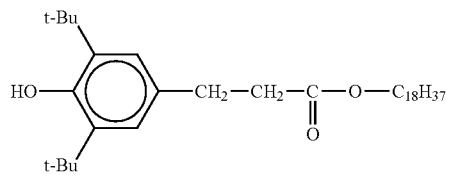

(IV)

[Formula V]

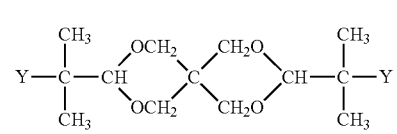

(V)

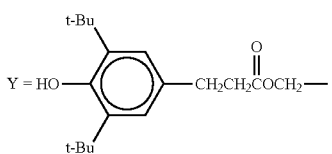

-continued

[Formula VI]

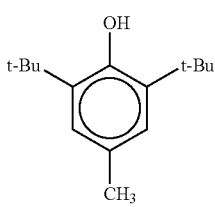
(VI)

[Formula VII]

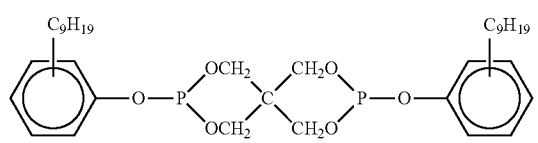
(VII)

[Formula VIII]

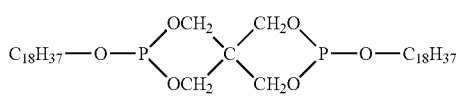
(VIII)

[Formula IX]

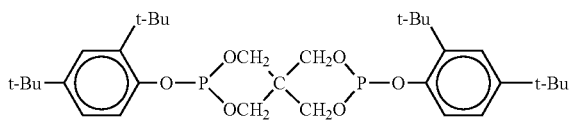
(IX)

[Formula X]

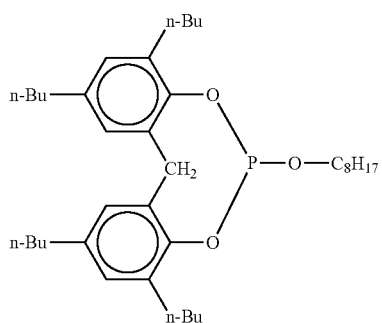
(X)

[Formula XI]

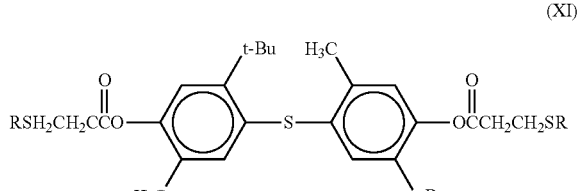
(XI)

[R: $C_{12}$-$C_{14}$ alkyl group]

[Formula XIII]

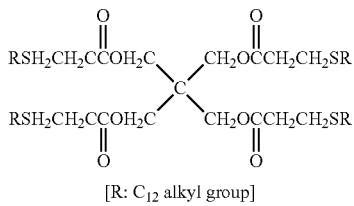
(XIII)

[R: $C_{12}$ alkyl group]

[Formula XIII]

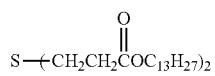
(XIII)

[Photosensitivity]

Each of the photosensitive resin compositions of the examples and comparative examples was coated onto a copper-clad laminated board (MCL-E-67, product of Hitachi Chemical Co., Ltd.) by screen printing to a post-drying thickness of 25 μm, and then a hot air circulating drier was used for drying at 75° C. for 30 minutes. To the surface of the obtained coating film there was adhered a phototool (product of Stouffer) with a 41-step tablet having a density range of 0.00-2.00, a density step of 0.05, a tablet (rectangular) size of 20 mm×187 mm and a step (rectangular) size of 3 mm×12 mm, and this was followed by irradiation with ultraviolet rays at a cumulative exposure dose of 600 mJ/cm², and then development for 60 seconds with 1 mass % aqueous sodium carbonate, after which the number of remaining steps were evaluated as the sensitivity. A larger number of remaining steps corresponds to higher sensitivity, and preferably 18 or more steps remain. The evaluation results are shown in Table 3 and Table 4.

[Opening Diameter]

Each of the photosensitive resin compositions of the examples and comparative examples was coated onto a copper-clad laminated board (MCL-E-67, product of Hitachi Chemical Co., Ltd.) by screen printing to a post-drying thickness of 25 μm, and then a hot air circulating drier was used for drying at 75° C. for 30 minutes. The obtained coating film was irradiated with ultraviolet rays at a cumulative exposure dose of 600 mJ/cm², through a negative film having φ80 μm and φ110 μm light-opaque sections interspersed in an area of 1×1 cm square, and this was followed by spray development for 60 seconds with 1 mass % aqueous sodium carbonate, at a pressure of 1.8 kgf/cm², and the unexposed sections were dissolved and developed for image formation. A microscope (Model: KH-3000 by HIROX) was then used to measure the opening diameter, which were evaluated on the following scale. The evaluation results are shown in Table 3 and Table 4.

A: Opening diameter of at least 80% (64 μm or greater with the φ80 μm negative film and 88 μm or greater with the φ110 μm negative film).

B: Opening diameter of at least 70% and less than 80% (56 μm or greater and less than 64 μm with the φ80 μm negative film and 77 μm or greater and less than 88 μm with the φ110 μm negative film).

C: Opening diameter of less than 70% (less than 56 μm with the φ80 μm negative film and less than 77 μm with the φ110 μm negative film).

[Fabrication of Test Piece]

Each of the photosensitive resin compositions of the examples and comparative examples was coated onto a 0.6 mm-thick copper-clad laminated board (MCL-E-67, product of Hitachi Chemical Co., Ltd.) by screen printing to a post-drying thickness of 25 μm, and then a hot air circulating drier was used for drying at 80° C. for 20 minutes. Next, a negative mask with a prescribed pattern was adhered to the coating film and an ultraviolet ray exposure apparatus was used for exposure at an exposure dose of 600 mJ/cm$^2$. This was followed by spray development for 60 seconds with 1 mass % aqueous sodium carbonate, at a pressure of 1.8 kgf/cm$^2$, and the unexposed sections were dissolved for development. Next, the ultraviolet ray exposure apparatus was used for exposure at an exposure dose of 1000 mJ/cm$^2$, and heating was performed at 150° C. for 1 hour to fabricate a test piece.

[Soldering Heat Resistance]

The test piece was coated with water-soluble flux and dipped for 10 seconds in a 265° C. solder tank. Counting this as 1 cycle, 6 cycles were repeated and then the outer appearance of the coating film was visually observed and evaluated on the following scale. The evaluation results are shown in Table 3 and Table 4.

A: No change in outer appearance.
B: 1 or 2 raised sections or blisters on the coating film within 50 mm$^2$ of the coating film.
C: 3 to 5 raised sections or blisters on the coating film within 50 mm$^2$ of the coating film.
D: 6 or more raised sections or blisters on the coating film within 50 mm$^2$ of the coating film.

[Thermal Shock Resistance]

The test piece was subjected to a thermal history with −55° C./30 min, 125° C./30 min as 1 cycle, and after the course of 1,000 cycles, the test piece was observed visually and with a microscope, and evaluated on the following scale. The evaluation results are shown in Table 3 and Table 4.

A: No cracking
B: Cracking

[Adhesive Strength Between Underfill Material and Cured Film after PCT Resistance Testing]

The test piece was cut to a 15 mm×15 mm size and dried at 120° C. for 12 hours. Silicone rubber with a size of 15 mm×15 mm×1.0 mm thickness, and provided with a ϕ3.0 mm opening, was placed on the test piece, and an underfill material was injected through the opening on a hot plate at 110° C., after which it was cured in a clean oven at 165° C. for 2 hours. After cooling to room temperature, the silicone rubber was removed to obtain a board for evaluation of adhesion with the underfill material. The board for evaluation of adhesion was used in a PCT test (121° C., 2 atm, 96 hours), and then a bond tester (Dage4000, product of Dage Co.) was used for measurement of the shear strength at room temperature, and the adhesive force per unit area was determined. Five samples were measured for each material, and the mean values were compared. The units were MPa. The height of the test head was 100 μm above the coating film, and the speed of the test head was 100 μm/sec. The composition of the underfill material was CEL-C-3801 (trade name of Hitachi Chemical Co., Ltd.), composed of a bisphenol F-type epoxy resin, an acid anhydride as the curing agent, and silica fine particles (67 mass %). The evaluation results are shown in Table 3 and Table 4.

[Warping Property]

A 5 cm-long, 5 cm-wide, 18 μm-thick copper foil was coated with each of the photosensitive resin compositions of the examples and comparative examples by screen printing to a post-drying thickness of 25 μm, and then a hot air circulating drier was used for drying at 75° C. for 30 minutes, and an ultraviolet ray exposure apparatus was used for exposure at an exposure dose of 600 mJ/cm$^2$. This was followed by spraying for 60 seconds with 1 mass % aqueous sodium carbonate, at a pressure of 1.8 kgf/cm$^2$. Next, the ultraviolet ray exposure apparatus was used for exposure at an exposure dose of 1000 mJ/cm$^2$, and heating was performed at 150° C. for 1 hour to obtain a test piece for evaluation of the warping property. The obtained test piece was placed on a platen with the coated side facing downward, and the warping height was evaluated. The evaluation results are shown in Table 3 and Table 4.

TABLE 3

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Photosensitivity (step) | 18 | 18 | 19 | 22 | 22 | 21 | 22 | 21 | 21 | 21 |
| Opening diameter | A | A | A | A | A | A | A | A | A | B |
| Soldering heat resistance | A | A | A | B | A | B | B | A | B | A |
| Adhesive strength after PCT resistance testing (MPa) | 4.7 | 5.1 | 5.2 | 4.2 | 5.3 | 4.2 | 4.4 | 4.9 | 3.6 | 5.3 |
| Thermal shock resistance | A | A | A | A | B | A | A | A | A | A |
| Warp property (mm) | 5 | 5 | 1 | 4 | 13 | 5 | 4 | 4 | 7 | 4 |

TABLE 4

|  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 | Comp. Ex. 10 | Comp. Ex. 11 |
|---|---|---|---|---|---|---|---|---|---|---|---|
| Photosensitivity (step) | 14 | 19 | 22 | 21 | 18 | 19 | 21 | 20 | 21 | 21 | 21 |
| Opening diameter | A | A | A | A | A | A | A | A | A | A | B |
| Soldering heat resistance | B | C | C | B | B | D | C | B | B | B | B |
| Adhesive strength after PCT resistance testing (MPa) | 2.1 | 1.1 | 2.2 | 2.2 | 2.8 | 1.6 | 2.6 | 1.1 | 2.3 | 2.1 | 1.3 |
| Thermal shock resistance | A | A | A | A | A | A | A | A | A | B | B |
| Warp property (mm) | 5 | 4 | 5 | 4 | 4 | 5 | 5 | 5 | 1 | 15 | 9 |

INDUSTRIAL APPLICABILITY

As explained above, it is possible according to the invention to provide a photosensitive resin composition for a protective film of a printed wiring board for a semiconductor package, which exhibits excellent adhesion between the underfill material and the cured film serving as the permanent mask resist, even after prolonged PCT resistance testing, as well as excellent soldering heat resistance.

The invention claimed is:

1. A photosensitive resin composition for a protective film of a printed wiring board for a semiconductor package, the photosensitive resin composition comprising:

(A) an acid-modified vinyl group-containing epoxy resin;

(B) a phenol compound, wherein the phenol compound is a compound represented by formula (1) or formula (10),

[Formula 1]

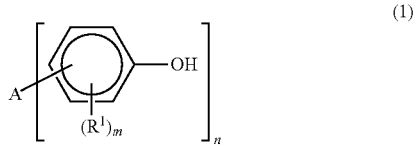

(1)

wherein, in formula (1), $R^1$ represents a $C_1$-$C_5$ alkyl group, m represents an integer of 1-4, n represents 3 and A is a trivalent organic group represented by formula (2), a plurality of $R^1$ groups may be the same or different,

[Formula 2]

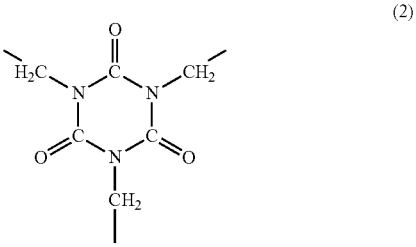

(2)

[Formula 10]

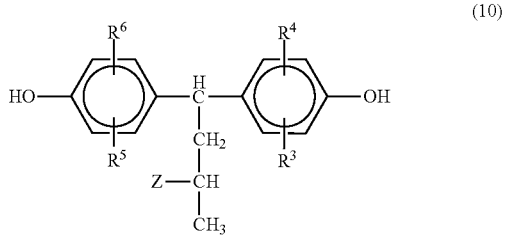

(10)

wherein, in formula (10), $R^3$, $R^4$, $R^5$ and $R^6$ each independently represent a $C_1$-$C_5$ alkyl group, and Z represents hydrogen or an organic group represented by formula (11),

[Formula 11]

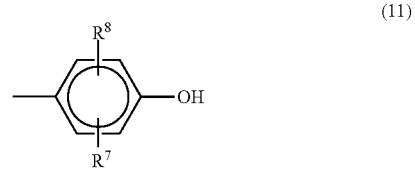

(11)

wherein, in formula (11), $R^7$ and $R^8$ each independently represent a $C_1$-$C_5$ alkyl group;

(C) a compound having at least one ethylenically unsaturated group in each molecule;

(D) a photopolymerization initiator; and (E) inorganic fine particles including barium sulfate, wherein the content of the phenol compound is 1.3-3 mass % based on the total solid mass of the photosensitive resin composition.

2. The photosensitive resin composition for a protective film of a printed wiring board for a semiconductor package according to claim 1, wherein, in formula (1), at least one $R^1$ is a tert-butyl group.

3. The photosensitive resin composition for a protective film of a printed wiring board for a semiconductor package according to claim 1, wherein the content of the (E) inorganic fine particles is 15-80 mass % based on the total solid mass of the photosensitive resin composition.

4. The photosensitive resin composition for a protective film of a printed wiring board for a semiconductor package according to claim 1, further comprising:

(F) a curing agent, wherein the (F) curing agent is a compound that cures under heat or ultraviolet rays, or a compound that cures upon reaction with the (A) acid-modified vinyl group-containing epoxy resin under heat or ultraviolet rays.

5. The photosensitive resin composition for a protective film of a printed wiring board for a semiconductor package according to claim 1, further comprising:

(G) an elastomer.

6. The photosensitive resin composition for a protective film of a printed wiring board for a semiconductor package according to claim 1, wherein the content of the barium sulfate is 10-60 mass % based on the total solid mass of the photosensitive resin composition.

7. The photosensitive resin composition for a protective film of a printed wiring board for a semiconductor package according to claim 1, wherein the content of the barium sulfate is 25-35 mass % based on the total solid mass of the photosensitive resin composition.

8. The photosensitive resin composition for a protective film of a printed wiring board for a semiconductor package according to claim 1, wherein the acid-modified vinyl group-containing epoxy resin is a resin that is formable by reacting a saturated or unsaturated group-containing polybasic acid anhydride with a resin obtained by reacting a vinyl group-containing monocarboxylic acid with an epoxy resin that is a bisphenol-type novolac resin having a repeating unit represented by formula (7) or formula (8),

[Formula 7]

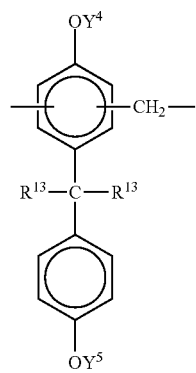

(7)

wherein, in formula (7), $R^{13}$ represents hydrogen or a methyl group, and $Y^4$ and $Y^5$ each independently represent hydrogen or a glycidyl group; the two $R^{13}$ may be the same or different; however at least one of $Y^4$ and $Y^5$ represents a glycidyl group;

[Formula 8]

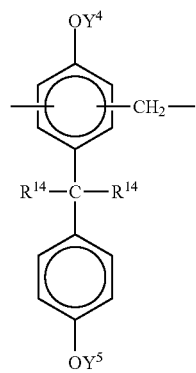

(8)

wherein, in formula (8), $R^{14}$ represents hydrogen or a methyl group, and $Y^6$ and $Y^7$ each independently represent hydrogen or a glycidyl group; the two $R^{14}$ may be the same or different; however at least one of $Y^6$ and $Y^7$ represents a glycidyl group.

9. A photosensitive resin composition for a protective film of a printed wiring board for a semiconductor package, the photosensitive resin composition comprising:

(A) an acid-modified vinyl group-containing epoxy resin;

(B) a phenol compound, wherein the phenol compound is a compound represented by formula (1) or formula (10),

[Formula 1]

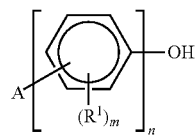

(1)

wherein, in formula (1), $R^1$ represents a $C_1$-$C_5$ alkyl group, m represents an integer of 1-4, n represents 3 and A is a trivalent organic group represented by formula (2), a plurality of $R^1$ groups may be the same or different,

[Formula 2]

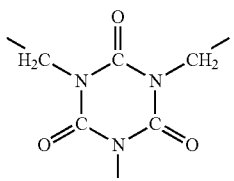

(1)

[Formula 10]

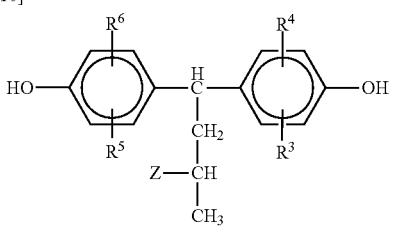

(10)

wherein, in formula (10), $R^3$, $R^4$, $R^5$ and $R^6$ each independently represent a $C_1$-$C_5$ alkyl group, and Z represents hydrogen or an organic group represented by formula (11),

[Formula 11]

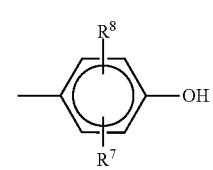

(11)

wherein, in formula (11), $R^7$ and $R^8$ each independently represent a $C_1$-$C_5$ alkyl group;

(C) a compound having at least one ethylenically unsaturated group in each molecule;

(D) a photopolymerization initiator; and (E) inorganic fine particles including barium sulfate, wherein the content of the phenol compound is 1.3-3 mass % based on the total solid mass of the photosensitive resin composition, wherein the (A) acid-modified vinyl group-containing epoxy resin is a resin obtained by reacting a saturated or unsaturated group-containing polybasic acid anhydride (c) with a resin obtained by reacting a vinyl group-containing monocarboxylic acid (b) with at least one type of epoxy resin (a) selected from the group consisting of novolac-type epoxy resins represented by the following formula (4), bisphenol-type epoxy resins represented by the following formula (5), salicylaldehyde-type epoxy resins represented by the following formula (6) and bisphenol-type novolac resins having a repeating unit represented by the following formula (7) or (8)

[Formula 4]

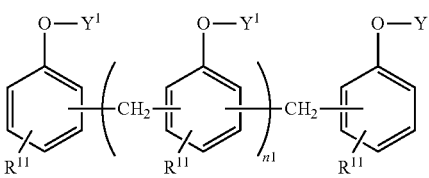

(4)

wherein in formula (4), $R^{11}$ represents hydrogen or a methyl group, $Y^1$ represents hydrogen or a glycidyl group, and n1 represents an integer of 1 or greater; a plurality of $R^{11}$ and $Y^1$ may be the same or different; however at least one $Y^1$ represents a glycidyl group;

[Formula 5]

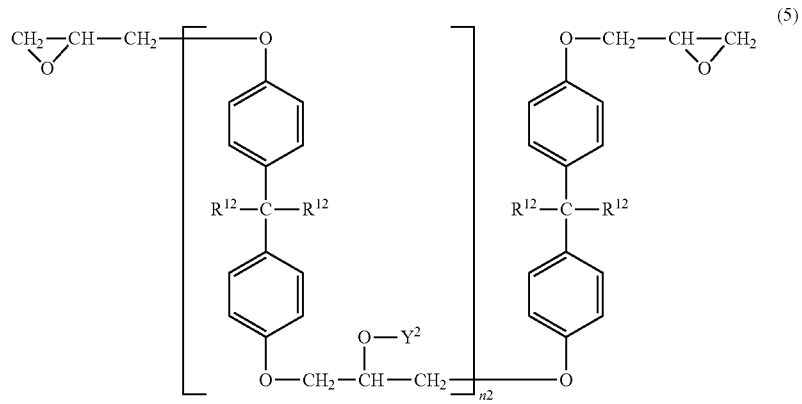

(5)

wherein in formula (5), $R^{12}$ represents hydrogen or a methyl group, $Y^2$ represents hydrogen or a glycidyl group, and n2 represents an integer of 1 or greater; a plurality of $R^{12}$ may be the same or different; when n2 is 2 or greater, a plurality of $Y^2$ may be the same or different;

[Formula 6]

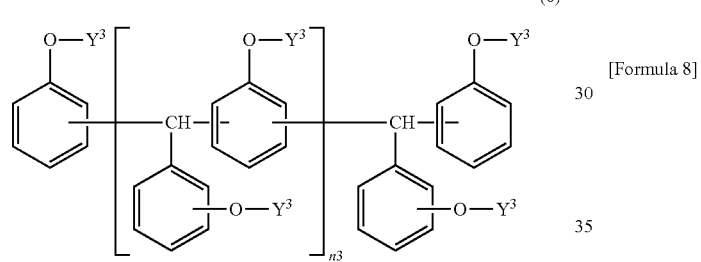

(6)

wherein in formula (6), $Y^3$ represents hydrogen or a glycidyl group, and n3 represents an integer of 1 or greater; a plurality of $Y^3$ may be the same or different, and however at least one $Y^3$ represents a glycidyl group;

[Formula 7]

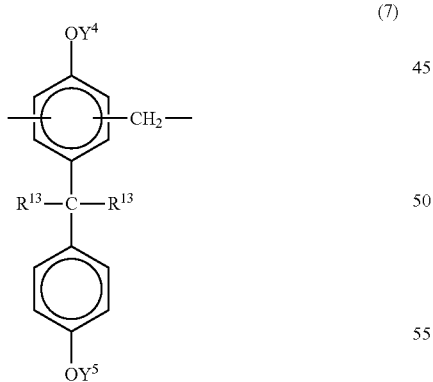

(7)

wherein in formula (7), $R^{13}$ represents hydrogen or a methyl group, and $Y^4$ and $Y^5$ each independently represent hydrogen or a glycidyl group; the two $R^{13}$ may be the same or different; however at least one of $Y^4$ and $Y^5$ represents a glycidyl group;

[Formula 8]

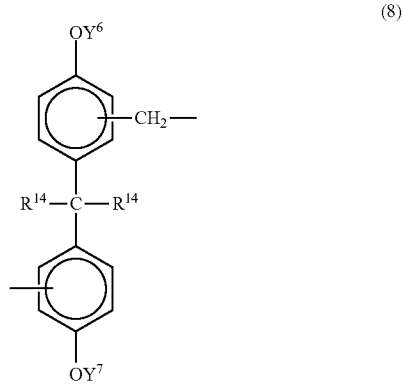

(8)

wherein in formula (8), $R^{14}$ represents hydrogen or a methyl group, and $Y^6$ and $Y^7$ each independently represent hydrogen or a glycidyl group; the two $R^{14}$ may be the same or different; however at least one of $Y^6$ and $Y^7$ represents a glycidyl group.

* * * * *

UNITED STATES PATENT AND TRADEMARK OFFICE
CERTIFICATE OF CORRECTION

PATENT NO. : 9,075,307 B2  
APPLICATION NO. : 13/062038  
DATED : July 7, 2015  
INVENTOR(S) : Kazuhiko Kurafuchi et al.

Page 1 of 1

It is certified that error appears in the above-identified patent and that said Letters Patent is hereby corrected as shown below:

In the claims

Column 33, Lines 36-43, [Formula 8] should appear as follows:

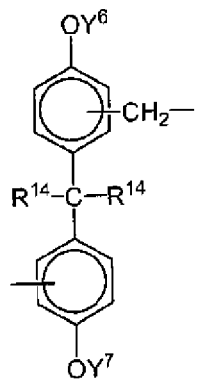

Signed and Sealed this  
Fifth Day of January, 2016

Michelle K. Lee  
*Director of the United States Patent and Trademark Office*